(12) United States Patent
Daruwalla et al.

(10) Patent No.: US 12,395,134 B2
(45) Date of Patent: Aug. 19, 2025

(54) PHASE SHIFT MATCHING FOR MULTI-PATH AMPLIFIERS

(71) Applicant: pSemi Corporation, San Diego, CA (US)

(72) Inventors: Parvez Daruwalla, San Diego, CA (US); Phanindra Yerramilli, San Diego, CA (US); Emre Ayranci, Costa Mesa, CA (US)

(73) Assignee: PSEMI CORPORATION, San Diego, CA (US)

( * ) Notice: Subject to any disclaimer, the term of this patent is extended or adjusted under 35 U.S.C. 154(b) by 505 days.

(21) Appl. No.: 18/049,002

(22) Filed: Oct. 24, 2022

(65) Prior Publication Data

US 2023/0148375 A1    May 11, 2023

Related U.S. Application Data

(63) Continuation-in-part of application No. 17/240,852, filed on Apr. 26, 2021, now Pat. No. 11,967,935.

(51) Int. Cl.
*H03F 1/22*     (2006.01)
*H03F 3/193*    (2006.01)
*H03F 3/195*    (2006.01)
*H04B 1/12*     (2006.01)

(52) U.S. Cl.
CPC ............ *H03F 3/195* (2013.01); *H03F 1/223* (2013.01); *H03F 3/193* (2013.01); *H04B 1/123* (2013.01); *H03F 2200/372* (2013.01); *H03F 2200/451* (2013.01)

(58) Field of Classification Search
CPC ........................................................ H03F 1/22
USPC .................................................. 330/311, 310
See application file for complete search history.

(56) References Cited

U.S. PATENT DOCUMENTS

| | | | |
|---|---|---|---|
| 7,696,841 | B2 | 4/2010 | Chen |
| 10,700,650 | B1 | 6/2020 | Ayranci et al. |
| 11,967,935 | B2 | 4/2024 | Ayranci et al. |
| 2008/0284522 | A1 | 11/2008 | Denoyer |
| 2010/0237947 | A1 | 9/2010 | Xiong et al. |
| 2011/0298545 | A1 | 12/2011 | Morimoto et al. |
| 2012/0105147 | A1 | 5/2012 | Harris et al. |

(Continued)

FOREIGN PATENT DOCUMENTS

WO    2022/231891 A1    11/2022

OTHER PUBLICATIONS

International Search Report and Written Opinion for International Application No. PCT/US2022/025413 filed on Apr. 19, 2022 on behalf of PSEMI Corporation Mail Date: Aug. 9, 2022 7 pages.

(Continued)

*Primary Examiner* — Henry Choe
(74) *Attorney, Agent, or Firm* — Steinfl + Bruno LLP

(57) ABSTRACT

Methods and devices to minimize or reduce phase discontinuity between different gain modes (including bypass, active and passive modes) with reduced increase in circuit size (footprint or number of components) and complexity, without impacting other performance parameters, are disclosed. Phase shifter elements that can be disposed in both the active and passive bypass paths are also described. Moreover, devices using the same reconfigurable phase shifter elements in both active and bypass modes are described. Components of the phase shifters can also perform output matching when the phase shifters are implemented as part of an RF receiver front-end.

27 Claims, 25 Drawing Sheets

(56) References Cited

U.S. PATENT DOCUMENTS

| | | |
|---|---|---|
| 2016/0181985 A1 | 6/2016 | Aoki |
| 2019/0020322 A1 | 1/2019 | Ayranci et al. |
| 2020/0099344 A1 | 3/2020 | Maalouf et al. |
| 2020/0106394 A1 | 4/2020 | Egambaram et al. |
| 2020/0266786 A1 | 8/2020 | Kovac et al. |
| 2022/0021363 A1 | 1/2022 | Cui et al. |
| 2022/0247364 A1 | 8/2022 | Padyana et al. |
| 2022/0345089 A1 | 10/2022 | Ayranci et al. |

OTHER PUBLICATIONS

Corrected Notice of Allowability for U.S. Appl. No. 17/240,852, filed Apr. 26, 2021 on behalf of PSEMI Corporation. Mail Date: Nov. 16, 2023. 2 Pages.

International Preliminary Report on Patentability for International Application No. PCT/US2022/025413 filed on Apr. 19, 2022 on behalf of PSEMI Corporation Mail Date: Nov. 9, 2023 6 pages.

Non-Final Office Action for U.S. Appl. No. 17/240,852, filed Apr. 26, 2021 on behalf of PSEMI Corporation Mail Date: Jul. 7, 2023 9 pages.

Notice of Allowance for U.S. Appl. No. 17/240,852, filed Apr. 26, 2021 on behalf of PSEMI Corporation Mail Date: Oct. 27, 2023 7 pages.

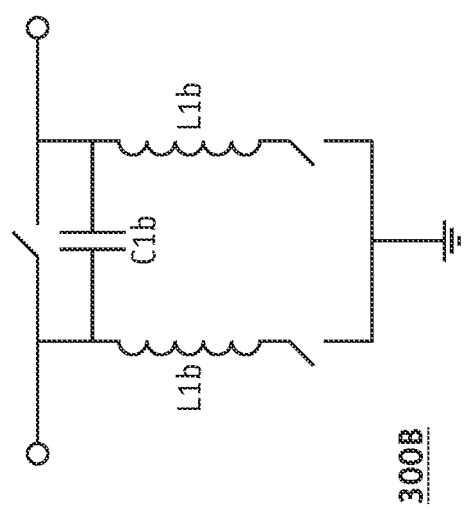
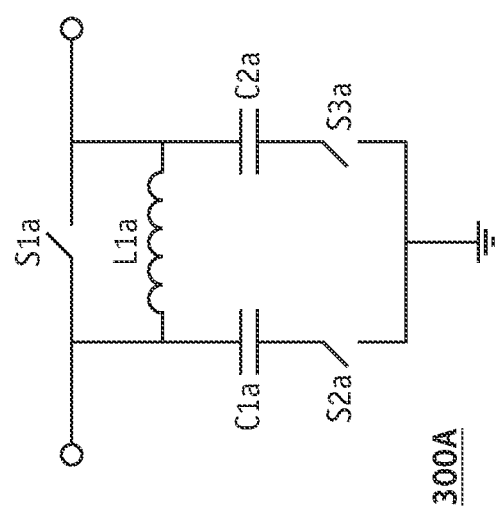
FIG. 3B
FIG. 3A

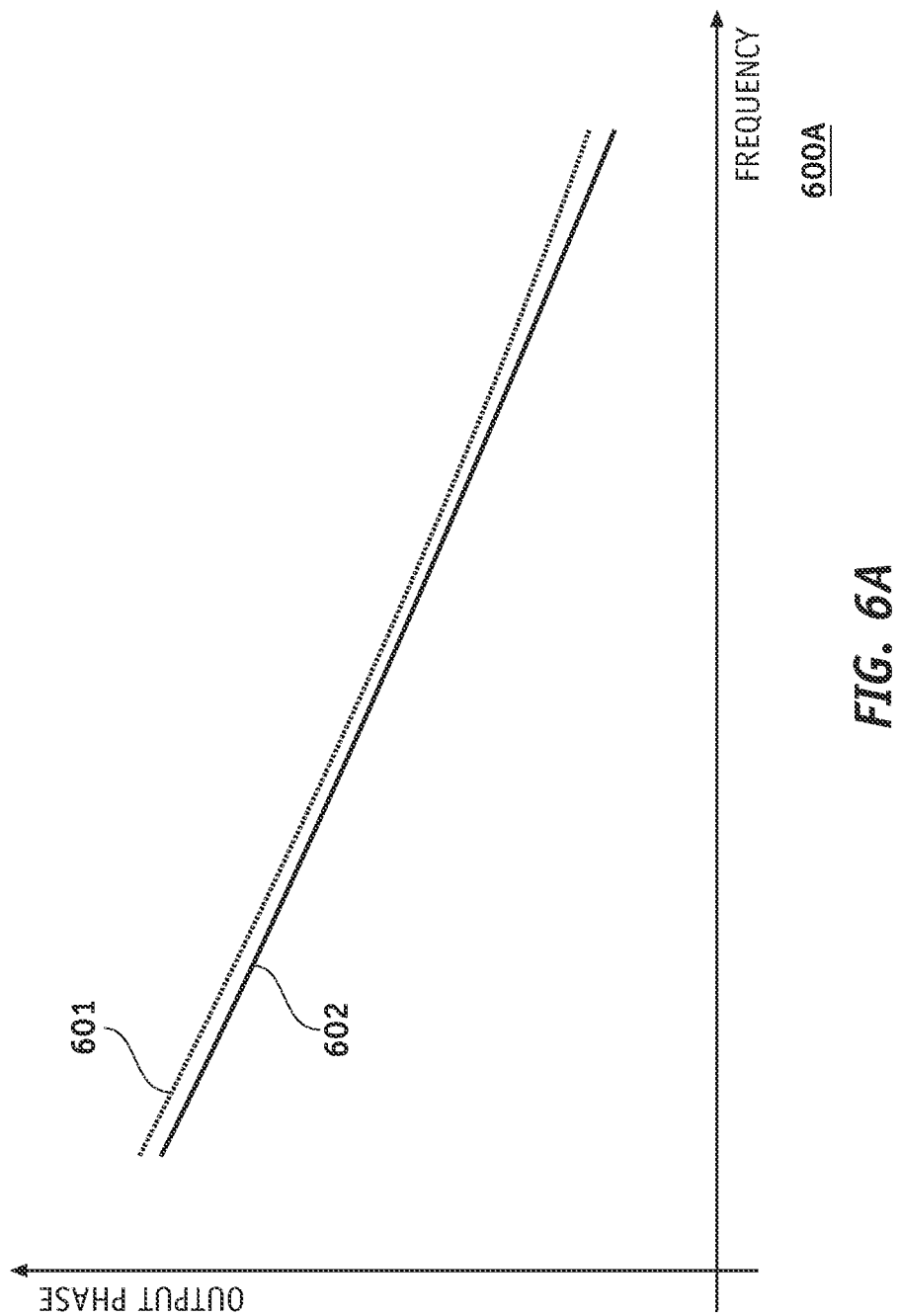

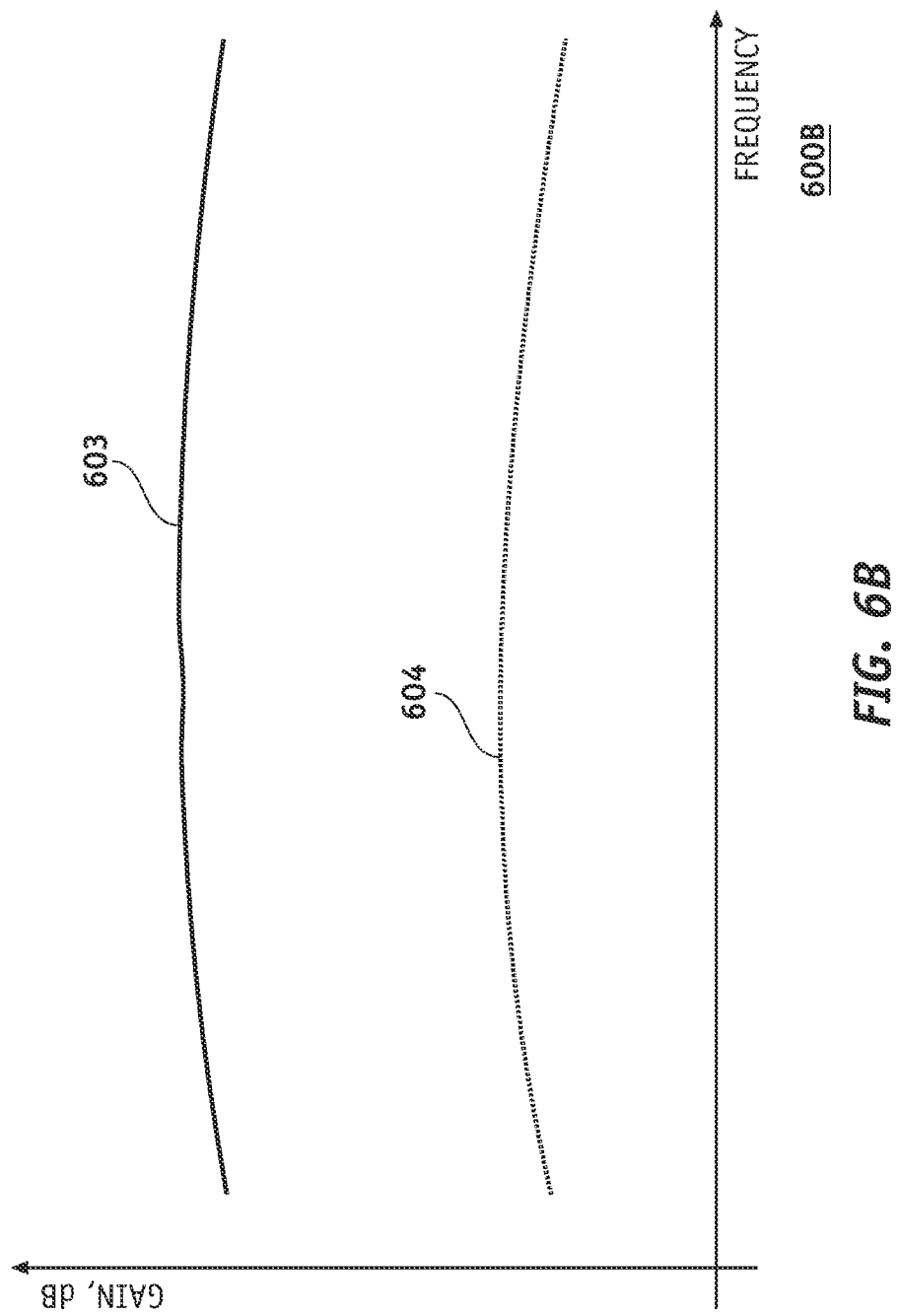

| PATH | SIGNAL ROUTE | LINEARITY | PHASE | IDD CURRENT |
|---|---|---|---|---|
| ACTIVE BYPASS | THROUGH AMPLIFIER | HIGH | IN-PHASE WITH OTHER GAIN MODES | LOW |
| PASSIVE BYPASS (NO SUB-CIRCUIT) | SWITCHES | VERY HIGH | OUT-OF-PHASE WITH OTHER GAIN MODES (e.g. 180 deg.) | VERY LOW |
| PASSIVE BYPASS W/SUB-CIRCUIT | SWITCHES | VERY HIGH | VERY CLOSE TO BEING IN-PHASE WITH OTHER GAIN MODES | VERY LOW |

|  | S11 | S12 | S13 | S14 | S15 | S16 | S17 | S18 | S19 |
|---|---|---|---|---|---|---|---|---|---|
| LOW PASS TEE | CLOSED | OPEN | CONNECTED TO TERMINAL a | INACTIVE | CONNECTED TO TERMINAL b | CONNECTED TO TERMINAL d | CLOSED | OPEN | CLOSED |
| HIGH PASS TEE | OPEN | CLOSED | CONNECTED TO TERMINAL a' | CONNECTED TO TERMINAL c' | INACTIVE | CONNECTED TO TERMINAL d' | OPEN | CLOSED | OPEN |

PHASE SHIFT MATCHING FOR MULTI-PATH AMPLIFIERS

CROSS-REFERENCE TO RELATED APPLICATIONS

The present application is a continuation-in-part application of U.S. patent application Ser. No. 17/240,852 filed on Apr. 26, 2021, the contents of which are incorporated herein by reference in their entirety.

TECHNICAL FIELD

The present disclosure relates to phase shift matching between output paths or between gain modes of electronic devices. It also relates to matching the phase shift between gain paths of low noise amplifiers (LNAs), and more in particular, active and passive bypass mode phase shift matching in such LNAs.

BACKGROUND

Multi-gain LNAs are very commonly used in applications such as cellular radio frequency front-end (RFFE) and alike. By imposing stringent and often conflicting requirements on performance metrics such as data rate, gain, gain flatness, linearity, noise figure, receiver sensitivity and power consumption, such applications present significant challenges to RF front-end design and architecture. In addition to meeting the mentioned requirements, such designs are expected to be cost effective with small footprints. Wideband, multi-path LNAs with multiple gain modes including active and passive modes have been designed to address the mentioned design challenges.

Generally, as a signal goes through an amplifier or an LNA, the elements of the amplifier can impose a phase shift from the input signal. For devices with different paths (e.g. different gain paths, such as high gain wideband paths vs. low current power saving paths) for the signal to traverse in different operation modes, these phase shifts can be different from one another. For example, in a low noise amplifier, there may be different selectable paths for different gains, including a bypass path for low gain. Some applications require that switching between these modes apply a minimal phase shift. As an example, the phase shift difference between all gain modes may be required to be less than ±5° or ±10° in some applications. Designing to meet such stringent requirement is a challenge, specifically in the applications where LNAs are required to switch between high gain wideband mode and low current lower gain modes to save power. Furthermore, switching to a passive gain mode introduces a large phase shift which may be prohibitive for certain applications. Matching the phase shifts between an active gain mode and a passive gain mode is highly desired when the LNA switches between the two modes during operative conditions.

In order to further clarify the above-mentioned issues, reference is made to FIG. 1A showing a simplified prior art RF receiver front-end (100A). The RF receiver front-end (100A) comprises amplifying cascode transistors (T1, T2), an input match circuit or network (101) and output match circuit or network (102). The input match network (101) comprises an input inductor (L1) and a degenerative inductor (L2). The output match network (102) comprises inductor (Ld), and capacitor (C1). The signal is received at input terminal (IN) and the amplified signal appears at output terminal (OUT) which is connected to load resistor (RL). RF receiver front-end (100A) further includes a source-follower circuit (103) including transistor (T3) and inductor (L3). RF receiver front-end (100A) receives bias voltages (V1, V2) as shown. Depending on the state of switches (S1, S2, S3) the input signal may selectively travel from input terminal (IN) to output terminal (OUT) via one of the two selected gain paths (110, 120). When switches (S1, S2, S3) are in (ON, ON, OFF) state, respectively, path (110) is selected. On the other hand, when switches (S1, S2, S3) are in respective (OFF, OFF, ON) states, path (120) is selected. Path (110) is selected in applications requiring higher gain with a wider band, while for applications where narrower band, lower gain and current are required, path (120) may be selected.

With continued reference to FIG. 1A, while operating in different conditions, the input signal may travel through different gain paths (i.e 110, 120 described above) and as a result, the input signal may undergo different phase shifting. In particular, FIG. 1B shows prior art graph (100B) showing the amplitude variation vs. time for various signals. Curves (130, 131, 132) represent input signal, output signal from path (110), and output signal from path (120), respectively. As can be seen, as a result of traveling through different paths corresponding to different gain modes, the input signal will experience different phase shifts. Therefore, there is a need for a device to be used, at least in one of the gain modes, to adjust for the phase shift difference.

SUMMARY

The disclosed teachings address the above-mentioned design challenges and problems. The described methods and devices minimize phase discontinuity between different gain modes (including bypass, active and passive modes) with minimal increase in circuit size (footprint or number of components) and complexity and without impacting other performance parameters. This is particularly useful for low noise amplifier design but can also be applied to other amplifier types and devices.

According to a first aspect of the present disclosure, a multi-path radio frequency (RF) front-end is provided, comprising: a plurality of first path elements forming a first path extending between an input node and an output node of the RF front end while the RF front-end is operating in a first mode, the first path elements including a first phase shifter providing a first phase shift; a plurality of second path elements forming a second path extending between the input node and the output node of the RF front end while the RF front-end is operating in a second mode, the second path elements including a second phase shifter providing a second phase shift; the RF front-end providing a first output signal at the output node while the RF front-end is operating in the first mode, the first output signal having a first output signal phase shift relative to an input signal applied to the input node; the RF front-end providing a second output signal at the output node while the RF front-end is operating in the second mode, the second output signal having a second output signal phase shift relative to an input signal applied to the input node. the first phase shift and the second phase shift being selected so that the first output signal and the second output signal are substantially in phase.

According to a second aspect of the present disclosure, a multi-path radio frequency (RF) front-end is provided, comprising: an active element, a plurality of first passive elements, and a configurable phase shifter forming a first active gain path; and a plurality of second passive elements forming a passive bypass path together with the configurable phase shifter, wherein: a) the first active gain path and the passive bypass path are configured to be selectively switched in or out; b) in a first state: the first active gain path is switched in; the passive bypass path is switched out, and the configurable phase shifter element is configured to be arranged according to a first topology; c) in a second state: the first active gain path is switched out; the passive bypass path is switched in; the configurable phase shifter element is configured to be arranged according to a second topology different from the first topology.

According to a third aspect of the present disclosure, a method of phase shift matching in a multi-path radio frequency (RF) front-end is disclosed, the RF front-end including: an active element and a plurality of first passive elements forming an active gain path inside the RF front-end, the active element providing an active element phase shift; a plurality of second passive elements forming a passive bypass path inside the RF front-end; the method comprising: providing a first phase shift in the active gain path downstream of the active element phase shift; and providing a second phase shift in the passive bypass path, wherein a sum of the first phase shift, the second phase shift and the active element phase shift is equal to 360°.

Further aspects of the disclosure are provided in the description, drawings and claims of the present application.

DESCRIPTION OF THE DRAWINGS

FIGS. 3A-3B and 4A-4B show example phase shifter elements in accordance with the embodiments of the present disclosure.

FIGS. 6A-6B show example graphs according to the additional embodiments of the present disclosure, illustrating the performance of the disclosed phase shifter elements.

FIG. 8B shows an example table according to an embodiment of the present disclosure, illustrating the performance of active and passive gain modes in different conditions.

FIG. 10B shows an example table according to an embodiment of the present disclosure, the table summarizing the states of switches and the corresponding configurations of the phase shifter element of FIG. 10A.

DETAILED DESCRIPTION

Throughout this document, the term "phase matching" refers to minimizing or effectively reducing the phase difference between two or more signals. The term "phase shift" refers to adjusting the phase of a signal to be temporally either ahead or behind the signal's previous phase. Changing the phase to be later in time can be referred to as increasing the phase or making a positive phase shift. Changing the phase to be earlier in time can be referred to as decreasing the phase or making a negative phase shift.

Throughout this document, the term "gain mode" refers to a mode of the circuit that provides a specific gain level (usually as a function of frequency) relative to other gain modes. The term "active mode" refers to a mode where the amplifying portion of the circuit including active devices such as transistors is active and not bypassed. The term "passive mode" refers to a mode where such amplifying portion is bypassed and the active elements are in OFF state.

Throughout this document, the term "gain path" refers to a circuit path to an output that has a gain or loss relative to other outputs. The term "bypass path" is a gain path that has a lower gain than most other gain paths and lower gain than any other non-bypass gain paths. A single given gain path can have multiple gain modes depending on what elements in the path are connected (via switches) during use. Gain paths can include transistor amplifiers such as one stage amplifiers (e.g. for low gain paths) and two stage amplifiers (e.g. for high gain paths).

Throughout this document, the terms "high pass phase shifting element" or "phase shift element with a high pass topology" refer to phase shifter elements that have similar topology to that of a high pass filter. The terms "low pass phase shifting element" or "phase shift element with a low pass topology" refer to phase shifter elements that have similar topology to that of a low pass filter.

Figure 1A:
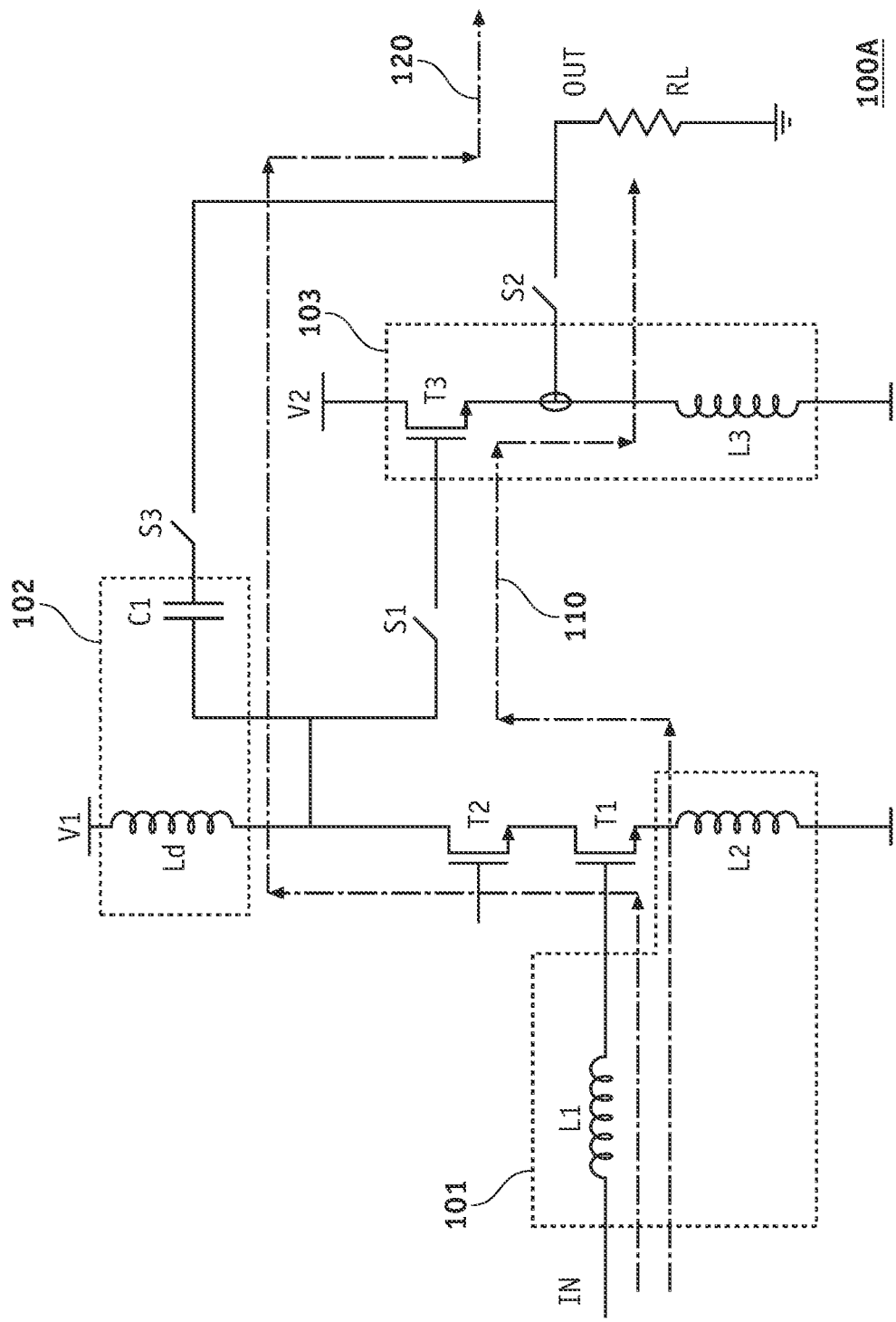
FIG. 1A shows a simplified prior art radio frequency (RF) receiver front-end.
Figure 1B:
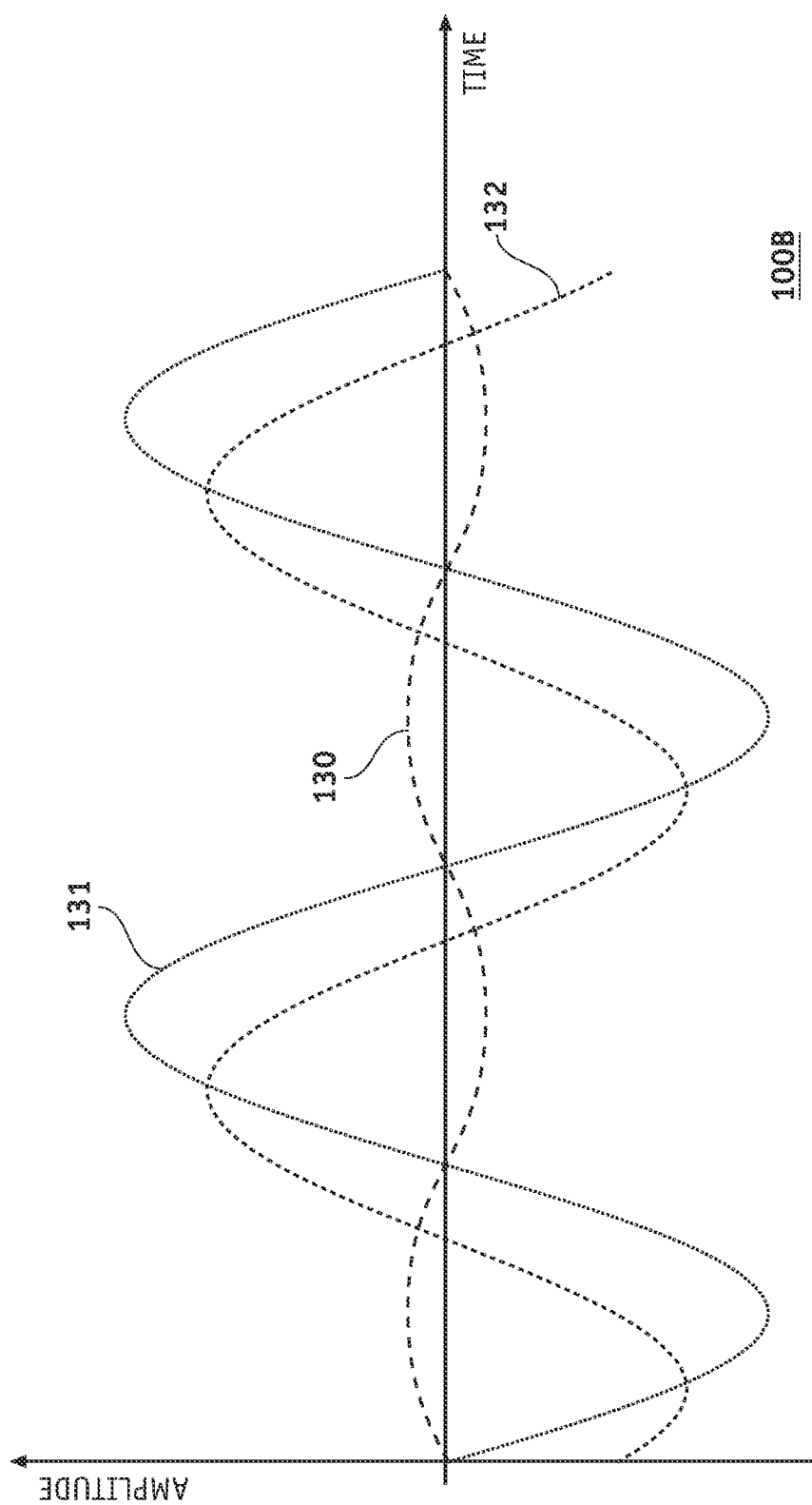
FIG. 1B shows a prior art graph illustrating the amplitude variation vs. time of various signals in a receiver front-end.
Figure 2A:
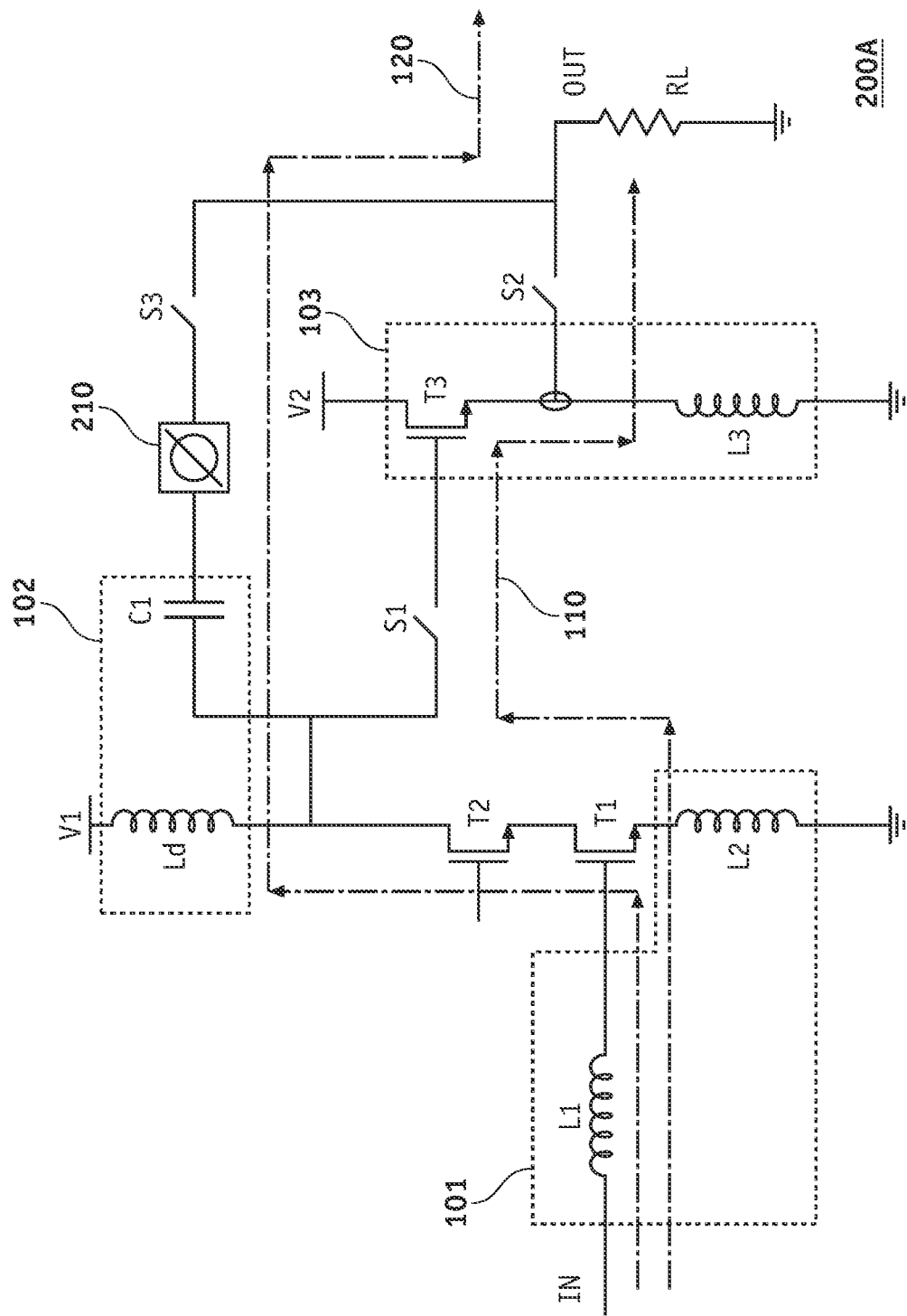
FIG. 2A shows an example RF receiver front-end according to an embodiment of the present disclosure.

FIG. 2A shows an example RF receiver front-end (200A) according to an embodiment of the present disclosure. The principle of operation of RF receiver front-end (200A) is similar to what was described with regards to RF receiver front-end (100A) except for the addition of phase shift element (210) which is used to match the phase shifts experienced by the input signal when passing through gain path (110) or (120). In this specific example, phase shift element (210) is disposed in the gain path (120) which represents the lower gain mode of the RF receiver front-end (200A).

Figure 2B:
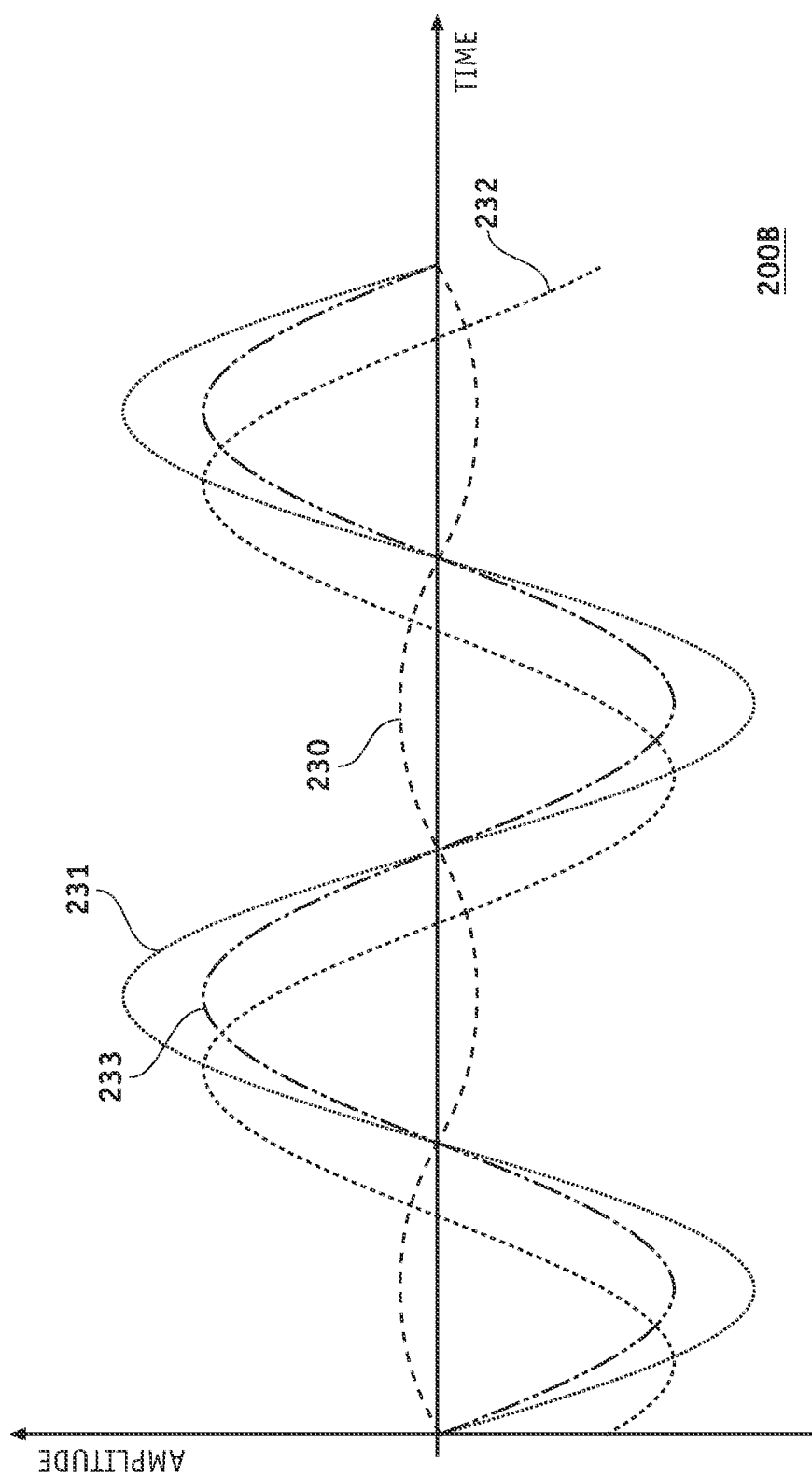
FIG. 2B shows an example graph according to an embodiment of the present disclosure, the graph showing amplitude variation vs. time for various signals related to the embodiment of FIG. 2A.

FIG. 2B shows an example graph (200B) according to an embodiment of the present disclosure, the graph showing the amplitude variation vs. time for various signals. Curves (230, 231) represent input signal and output signal from path (110). Curves (232, 233) represent output signal from path (120), before and after the addition of phase shift element (210), respectively. Comparing curves (231, 233), it can be noticed that by virtue of adding phase shift element (210) the phase shift difference between gain paths (110, 120) has been reduced or minimized.

Figure 2C:
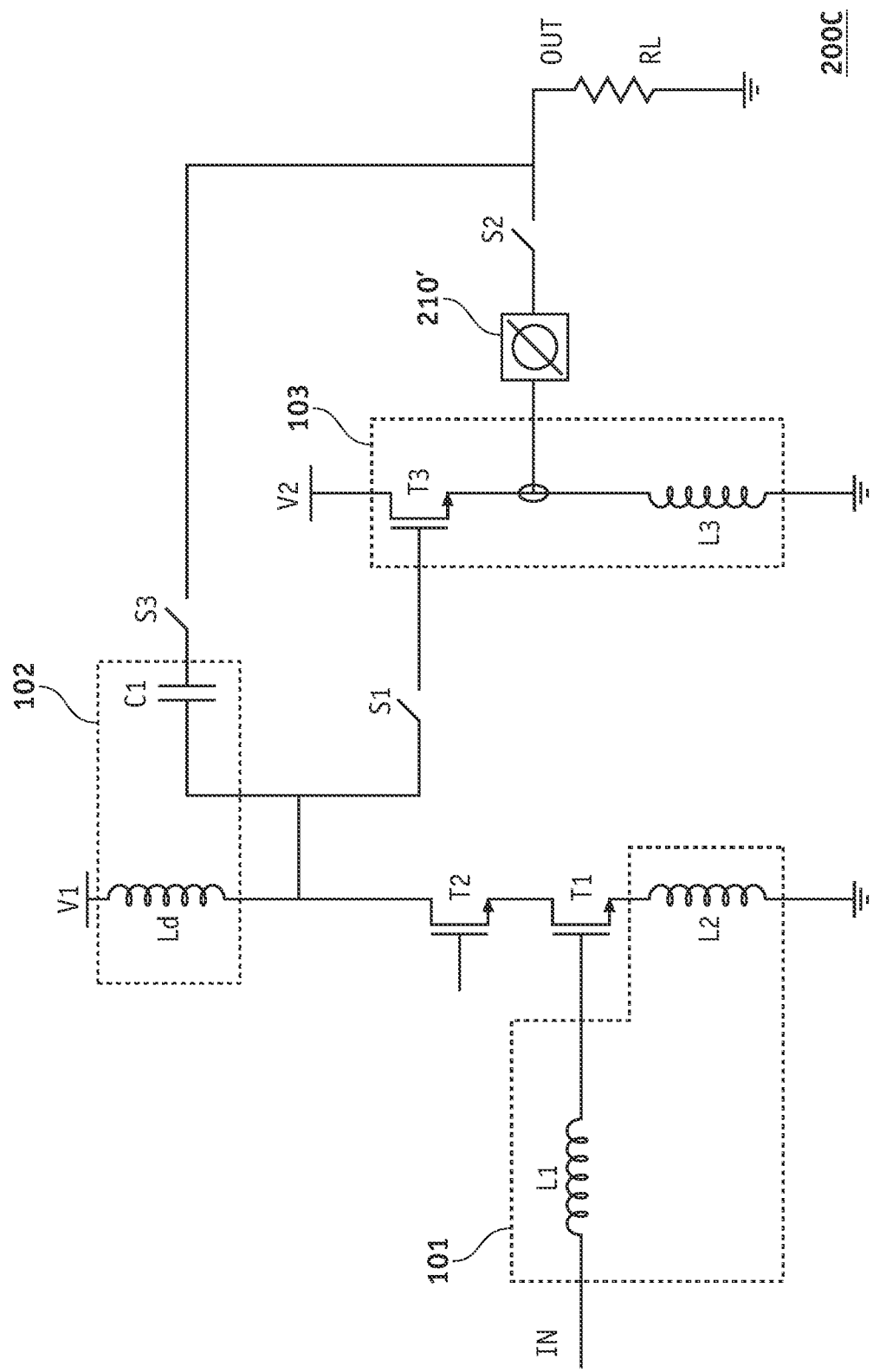
FIG. 2C shows an example RF receiver front-end according to a further embodiment of the present disclosure.

FIG. 2C shows an RF receiver front-end (200C) according to an embodiment of the present disclosure. The principle of operation of RF receiver front-end (200C) is similar to what was described with regards to RF receiver front-end (200A) except that phase shift element (210') is implemented in gain path (110) instead of gain path (120) of FIG. 2A.

Referring to both FIGS. 2A and 2C, such embodiments are example and represent LNAs with two gain paths. The teachings of the disclosure equally apply to LNAs having more than two gain modes/paths including any number of passive gain, active gain, or bypass modes. According to further embodiments of the present disclosure, phase shift elements (210, 210') can be disposed anywhere in their respective paths. There can be one phase shift element, or multiple phase shift elements arranged in a cascaded configuration or in parallel, so long as the cumulative effect is that the multiple paths are all phase matched. These phase shift elements can take many forms, depending on the requirements of the phase shift element at that location, and they can be implemented for both positive and negative phase shift directions. In an embodiment, the highest gain mode is used as the reference phase and other gain modes are phase-shifted to match the highest gain mode. This prevents loss in the highest gain mode due to any addition of elements (e.g. the phase shifter). In another embodiment, a different reference is used, for examples another gain mode (whereby that gain mode would not be phase shifted) or an external reference phase (whereby all gain modes are phase shifted).

Figure 4B:
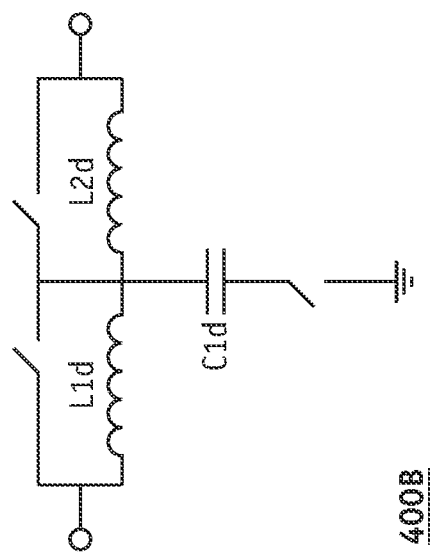
Figure 4A:
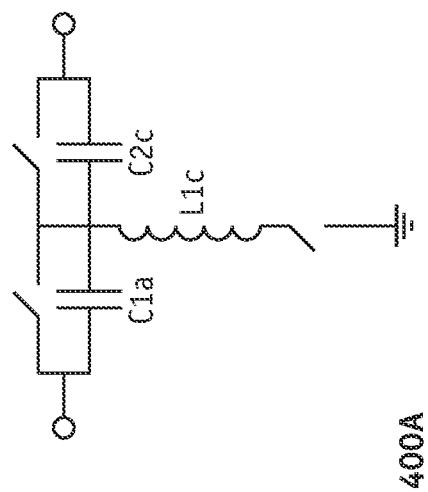

FIGS. 3A-3B, and 4A-4B show example phase shifter elements in accordance with the embodiments of the present disclosure. These embodiments represent example implementations of the phase shifters (210, 210') of FIGS. 2A, and 2C. Phase shifter element (300A) of FIG. 3A is a low pass PI phase shifter with a negative phase shift, with one inductor (L1a) in series and two capacitors (C1a, C2a) in parallel. Phase shifter element (300B) of FIG. 3B is a high-pass PI phase shifter element with a capacitor (C1b) in series and two inductors (L1b, L2b) in parallel. Phase shifter element (400A) of FIG. 4A is a high-pass TEE phase shifter element with two capacitors (C1c, C2c) in series and one inductor (L1c) in parallel. Phase shifter element (400B) of FIG. 4B is a low pass TEE phase shifter with two inductors (L1d, L2d) in series and one capacitor (C1d) in parallel.

Referring to FIGS. 3A-3B and 4A-4B, each of the phase shift elements shown further includes switches to control (insert or remove) the phase shift, as well as selecting which elements of the phase shift element are active. In other words, using switches, either one of the corresponding phase shifters can be switched in or out, and when a phase shifter is switched in, the amount of phase shift can be controlled using the switches. For example, phase shifter (300A) of FIG. 3A includes switches (S1a, S2a, S3a). When switches (S1a, S2a, S3a) are in (ON, OFF, OFF) state, respectively, phase shift element (300A) is switched out of the circuit. When switches (S1a, S2a, S3a) are in (ON, ON, ON) state, respectively, inductor (L1a) is bypassed and capacitors (C1a, C2a) are engaged to provide a desired phase shift. When switches (S1a, S2a, S3a) are in (OFF, ON, ON) state, respectively, all of the constituents (L1a, C1a, C2a) are switched in to provide another desired phase shift. As a further example, when switches (S1a, S2a, S3a) are in (OFF, ON, OFF) state, respectively, elements (L1a, C1a) are switched in and capacitor (C2a) is switched out, in which case this configuration provides yet another desired phase shift. Note that by virtue of such selective control of various components of the phase shift elements, the RF receiver front-end implementing these phase shift elements can properly be used for different gain modes and/or different frequency bands of operation, as needed. The functionality of the switches shown as parts of the embodiments of FIGS. 3B, and 4A-4B are similar to what was described above with regards to switches (S1a, S2a, S3a) of FIG. 3A.

With reference again to FIGS. 2A, and 2C, in addition to phase matching of various paths, phase shift elements (210, 210') can also be used, in combination with other elements of the circuit, to provide at the same time other functionalities, such as output matching. If in the path where the phase shift element is disposed, there already exists another element (e.g. inductor or capacitor) which is implemented, for example, for output matching purposes, such element may be reused as part of the phase shifter element to take also part in the phase shift matching functionality. This provides the benefit of saving on-chip space which is crucial for most applications. In what follows some example embodiments are presented to further clarify the above-disclosed method of reusing some circuit elements when combining circuit functionalities.

Figure 5A:
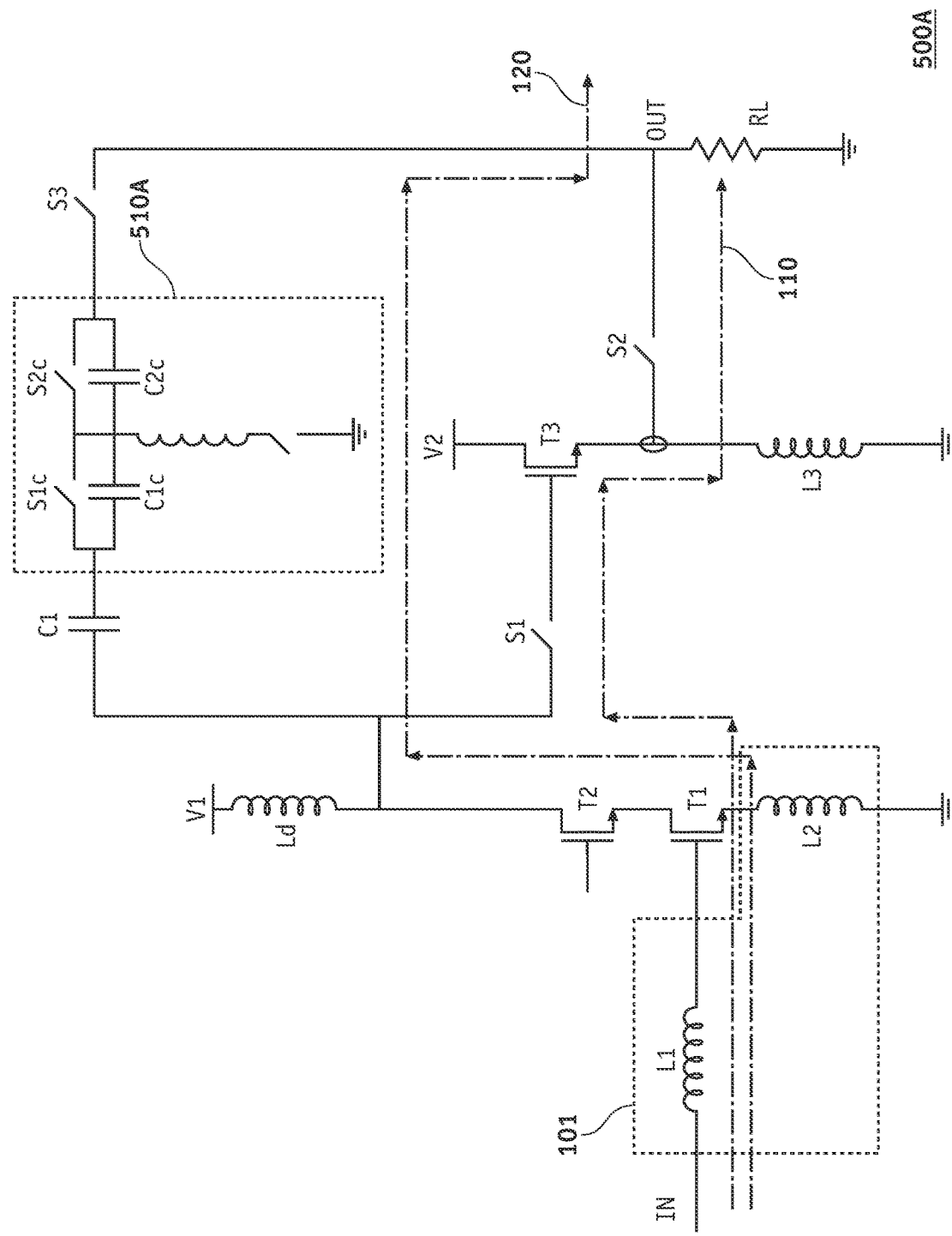
FIGS. 5A-5D show example RF receiver front-ends according to additional embodiments of the present disclosure.

FIG. 5A shows an RF receiver front-end (500A) according to an embodiment of the present disclosure. This embodiment is similar the one shown in FIG. 2A. Phase shifter element (510A) is an implementation of phase shifter element (210) of FIG. 2A using the high-pass TEE topology as shown in FIG. 4A. As mentioned previously with regards to the embodiment of FIG. 2A, when switches (S1, S2, S3) are in the (OFF, OFF, ON) state, respectively, gain path (120) is selected. In this case, the output matching is performed by the output matching network (102) including inductor (Ld) and capacitor (C1). Turning now back to FIG. 5A and in the same case, a combination of elements (Ld, C1) and phase shifter element (510A) will now perform the task of output matching, wherein phase shifter element (510A) is designed such that the difference between the phase shifts of gain paths (110, 120) is minimized.

Figure 5B:
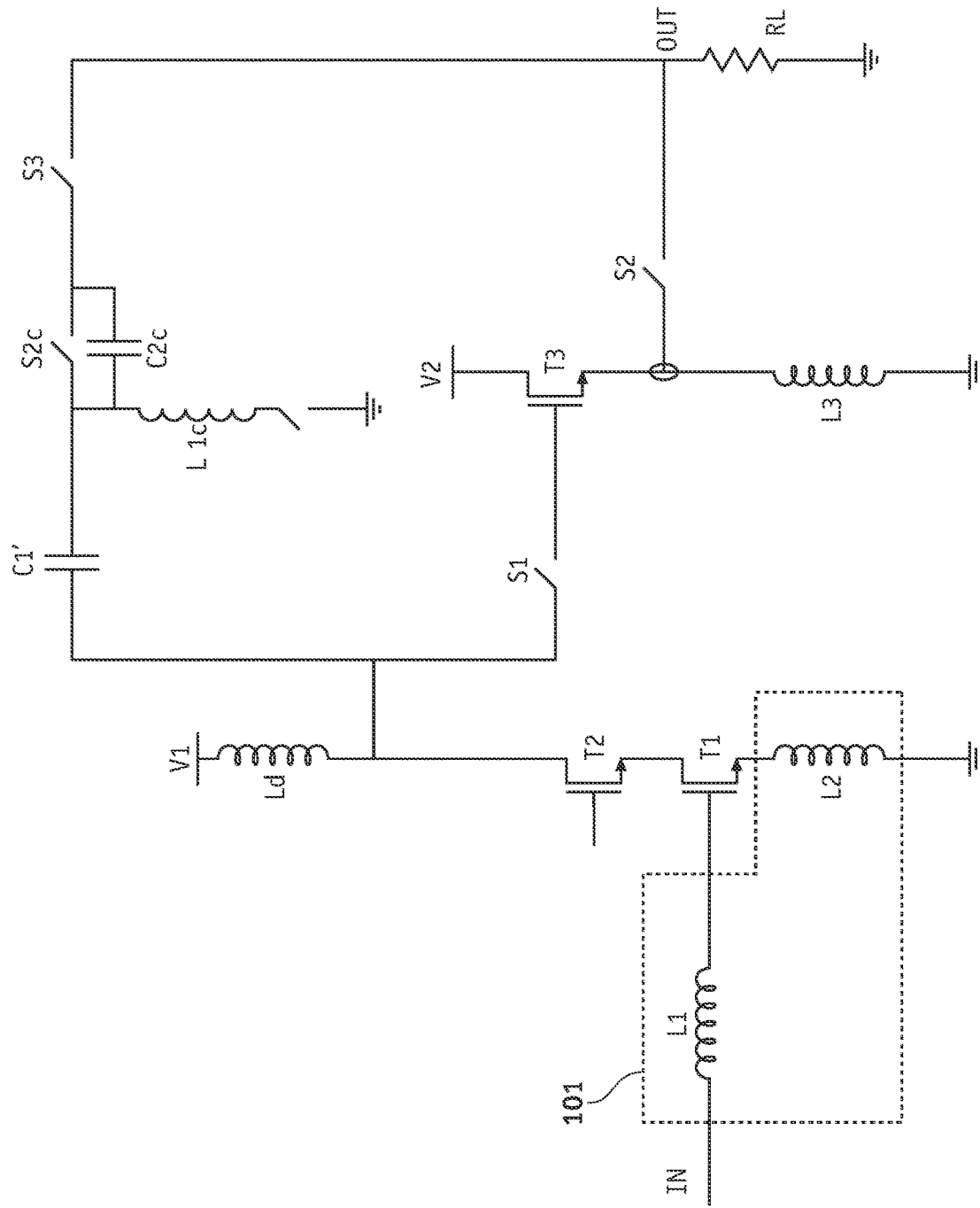

According to an embodiment of the present disclosure, in order to save on-chip space, capacitors (C1, C1c) can be combined into a single capacitor. This is illustrated in FIG. 5B where such combination is represented by capacitor (C1'). RF receiver front-end (500B) of FIG. 5B is similar to that of FIG. 5A, however the former has two elements less than its counterpart in its implementation, i.e. switch (S1c) and capacitor (C1c) have been removed.

Figure 5C:
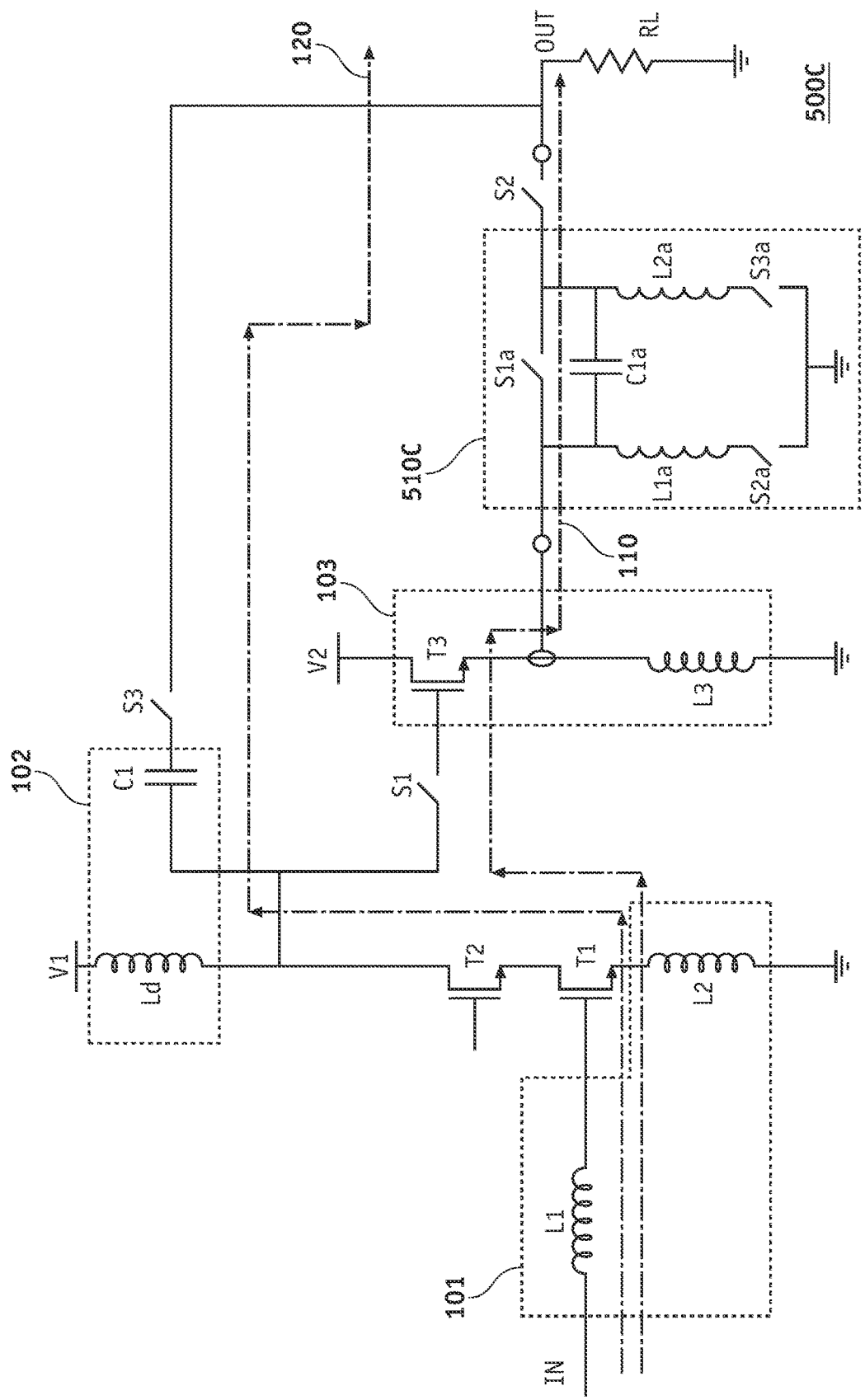
Figure 5D:
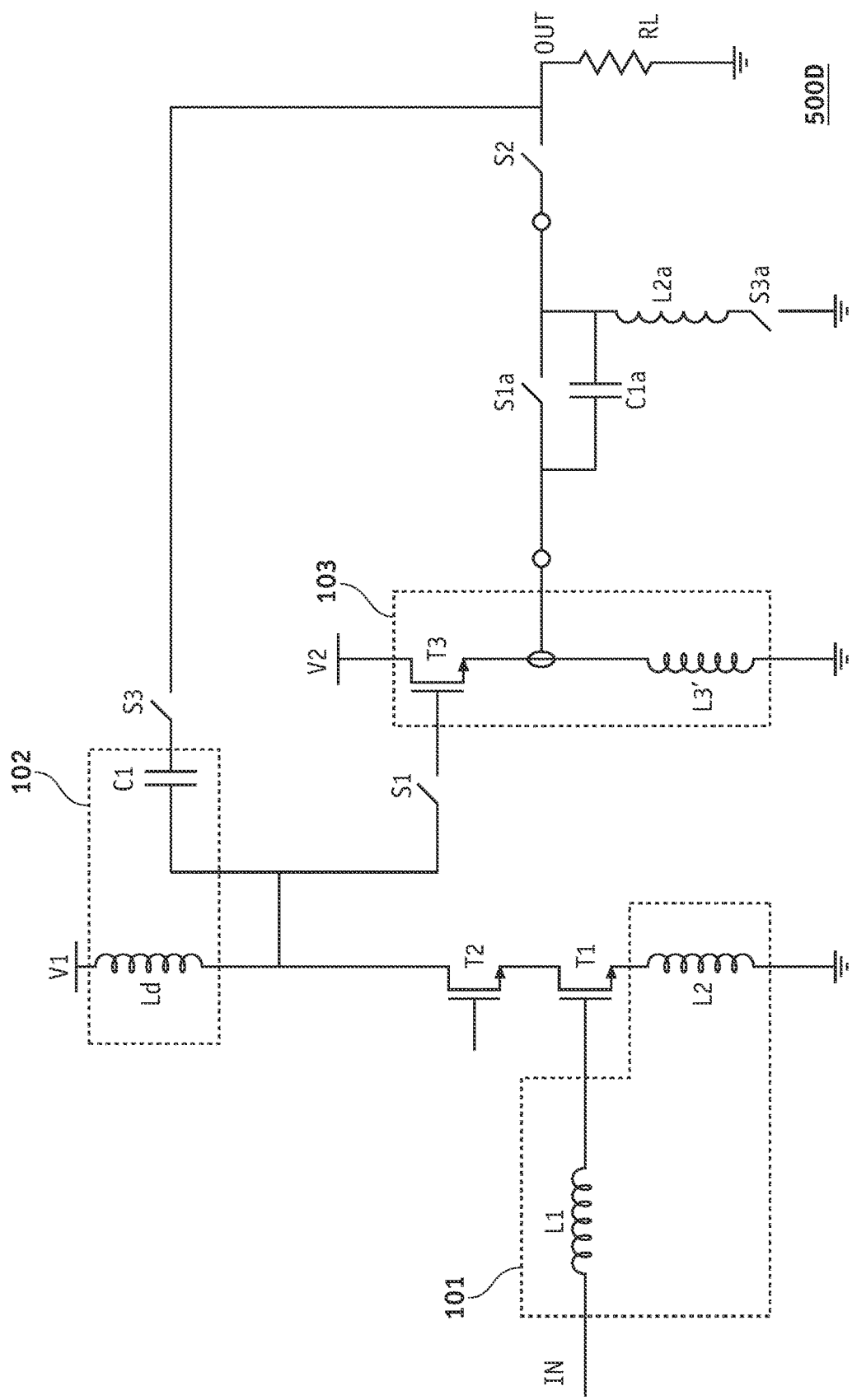

FIG. 5C shows an RF receiver front-end (500C) according to an embodiment of the present disclosure. This embodiment is similar the one shown in FIG. 2C. Phase shifter element (510C) is an implementation of phase shifter element (210') of FIG. 2C using the high pass PI topology as shown in FIG. 3A. As mentioned previously with regards to the embodiment of FIG. 2A, when switches (S1a, S2a, S3a) are in the (ON, ON, OFF) state, respectively, gain path (110) is selected. In this case, the output matching is performed by source-follower (103) through inductor (L3). Turning now back to FIG. 5C, and in the same case, a combination of inductor (L3) and phase shifter element (510C) will now perform the task of output matching, wherein phase shifter element (510C) is designed such that the difference between the phase shifts of gain paths (110, 120) is reduced or minimized. According to an embodiment of the present disclosure, in order to save on-chip space, inductors (L3, L1a) can be combined into one inductor. This is illustrated in FIG. 5D where such combination is represented by inductor (L3'). RF receiver front-end (500D) of FIG. 5D is similar to that of FIG. 5C, however the former has two elements less than its counterpart in its implementation, i.e. switch (S2a) and inductor (L1a) have been removed.

FIG. 6A in an example graph (600A) according to an embodiment of the present disclosure. Graph (600A) shows that, using a phase shift element (see e.g. FIGS. 2A-2B), the phases of the low gain path (601) and high gain path (602) remain relatively close over the frequency range. FIG. 6B shows that the gain (604) of the low gain path has a lower gain as compared to the gain (603) of the high gain path over that same range, i.e. the former path still remains a low gain path.

Figure 7:
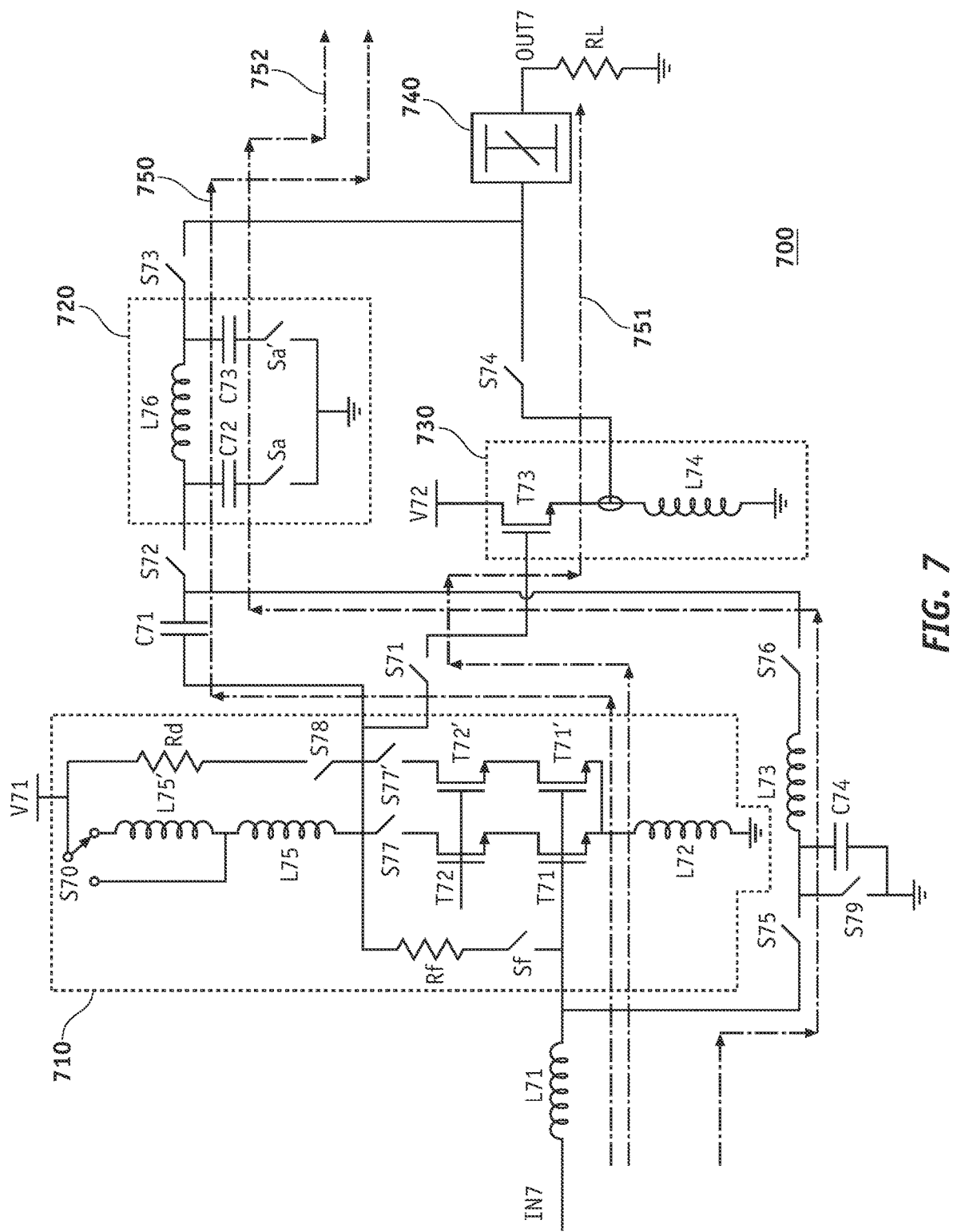
FIG. 7 shows an example RF receiver front-end according to yet another embodiment of the present disclosure.

FIG. 7 shows an example RF receiver front-end (700) according to an embodiment of the present disclosure. RF receiver front-end (700) is essentially a multiple gain/path LNA including a first stage amplifier (710), a second stage amplifier (730) arranged in a source-follower configuration, a phase shifter element (720), and a programable attenuator (740). The RF receiver front-end is configured to receive voltages (V71, V72) for biasing purposes, and also to receive an input signal at input terminal (IN7) and provide an output signal at output terminal (OUT7). Based on the desired mode of operation, one of the gain paths (750, 751, 752) can be selected depending on the state of switches (S71, S72, . . . , S76). Gain paths (750, 751, 752) correspond to active low gain, active high again, and passive bypass mode, respectively. Phase shifter element (720) has the same topology as the embodiment of FIG. 3A. First stage amplifier (710) comprises several switches to control the desired gain mode (i.e. high, low) and bandwidth (i.e. narrowband, wideband) of operation. Additionally, such switches are also used to switch in and out various components within first stage amplifier (710) for an optimized input and output matching.

With continued reference to FIG. 7, the following briefly summarizes the features implemented within first stage amplifier (710):

depending on the state of switches (S77, S77'), one of the cascode transistor pairs (T71, T72, or T71', T72') are switched in;

depending on the required output matching, a larger inductor, i.e. a combination of inductors (L75, L75'), or a smaller inductor, i.e. inductor (L75) may be used. This can be controlled through different states of switch (S70);

resistor ($R_d$) may be switched in when switch (S78) is ON (closed) As a result, wider band output matching is achieved at the expense of the gain; and feedback resistor (Rf) may be switched in and out using switch (Sf). Such resistor may be switched in for a wider band input matching. When switched in, the input matching is performed using a combination of feedback resistor (Rf) and inductors (L71, L72).

Still referring to FIG. 7, second stage amplifier (730), which has a source-follower configuration, may be switched in for wider band operation where a wider output matching is required. In the active low gain mode where gain path (750) is selected, phase shift element (720) is used to match the phase shift of path (750) with those of paths (751, 752). In the active low gain mode, one or both switches (Sa, Sa') may be ON (closed) depending on the phase shift required for phase shift matching. Additionally, combined with capacitor (C1), inductor (L75), and inductor (L75') if switched in, together with resistor (Rd) if switched in, phase shifter (720) contributes also to output matching. In other words, the phase shift element (720) performs the two functions of output matching and phase shift matching simultaneously. In applications requiring higher gain and wider bands, gain path (751) is selected and second stage amplifier (730) is switched in. The output matching is performed through inductor (L74) within second stage amplifier (730).

According to an embodiment of the present disclosure, when operating in the bypass passive gain mode, gain path (752) is selected by closing switches (S75, S76, S73) and opening switches (S71, S72, S74). As a result, the first and the second stage amplifiers (710, 730) are bypassed. When operating in this mode, improved linearity and power consumption can be achieved. In this mode, switches (Sa, Sa') may be opened and a combination of inductor (L76) and (L73) perform the function of output matching. In an embodiment, in line with the above-disclosed teachings with regards to the embodiments of FIGS. 5A-5D, inductor (L76) of phase shifter element (720) may be combined with inductor (L73) into a single inductor to save on-chip space, a crucial factor in most applications. Programmable attenuator (740) may be used to achieve the desired overall gains when operating in different gain modes. In the scenarios where gain path (752) is not selected, switch (S79) may be ON (closed) for further isolation.

Figure 8A:
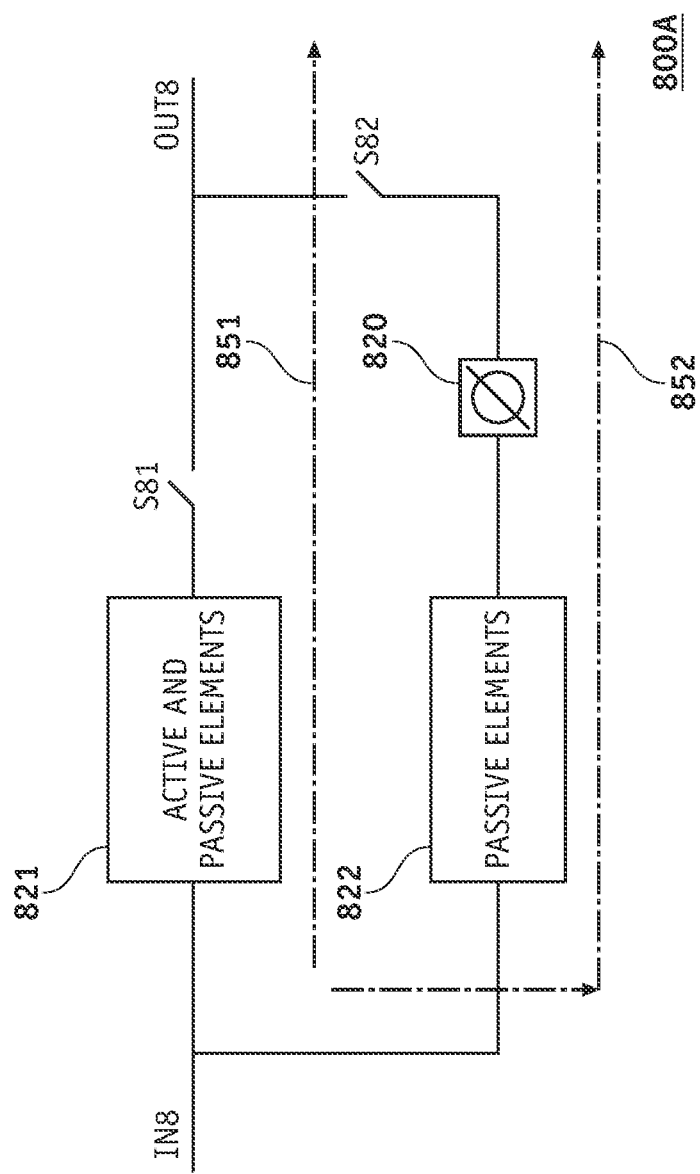
FIG. 8A shows an example RF receiver front-end according to an embodiment of the present disclosure.

FIG. 8A shows a simplified block diagram of an example RF front-end unit (800A) according to an embodiment of the present disclosure. During operative conditions, the input signal is received at input terminal (IN8) and an output signal is generated at output terminal (OUT8). The RF front-end operates either in an active gain mode or a passive gain bypass mode. When operating in the active gain mode, switches (S81, S82) are in the (ON, OFF) state, respectively. In this mode, gain path (851) including several active and passive elements (821) is traveled by the input signal. On the other hand, when operating in the passive gain mode, switches (S81, S82) are in the (OFF, ON) state, respectively. In this mode, gain path (852) including passive elements (822) is traveled by the input signal.

Often times, as a result of having to comply with stringent and conflicting requirements, the design of active and passive elements (821) to be used in the active gain mode is rather complex. It may involve amplifying transistors, several inductor and capacitor banks and a switch network to adjust the design to various gains, bandwidths and input/output matching requirements. This may have negative impact on performance parameters such as linearity and power consumption. Additionally, such complex design will require more on-chip space which is not desirable. According to the teachings of the present disclosure, the design of such RF receiver front-ends can be simplified by implementing a phase shifter in the passive bypass mode to minimize the phase shift differences between various gain modes while bypassing the active gain path, thereby avoiding the above-mentioned issues. This is illustrated in FIG. 8A, wherein phase shifter (820) is added in the passive gain bypass path (852). In other words, with the passive bypass corrected, the active bypass is no longer needed and can be removed from the circuit. This allows the circuit to have a smaller footprint, reduced complexity (thus better high gain mode performance), lower cost, etc.

In order to further clarify the benefits of the above-disclosed teachings, reference if made to FIG. 8B showing an example table (800B) that summarizes the differences between the different paths, with and without the phase shifter element (820) added. As shown in table (800B), the addition of the phase shifter element in bypass mode provides a very high linearity with high phase matching with the least IDD current (supply current) consumed.

In the example embodiments shown so far, the phase shifter element is implemented in one path. Other embodiments according to the present disclosure may be envisaged where phase shifter elements may be implemented in more than one path (e.g. one in the active path and one in passive bypass path). Because of power budgets, low current consumption may be crucial in some applications. In addition, same applications may have stringent requirements of the overall linearity performance. As a result, using a bypass mode in such applications is highly desired. In operative conditions, when the receiver front-end switches from an active to a bypass mode, a large phase shift, typical 180° may occur. The 180° phase shift comes from the amplifier portion of the active path. Many applications ask for +/−5° or 10° of phase difference between the gain paths which is quite strict. This stringent phase shift requirement along with tight gain requirements along the passive bypass mode can pose serious challenges in RF receiver front-end design. In what follows, embodiments in accordance with the teachings of the present disclosure and addressing such design challenge are described in detail.

Figure 9A:
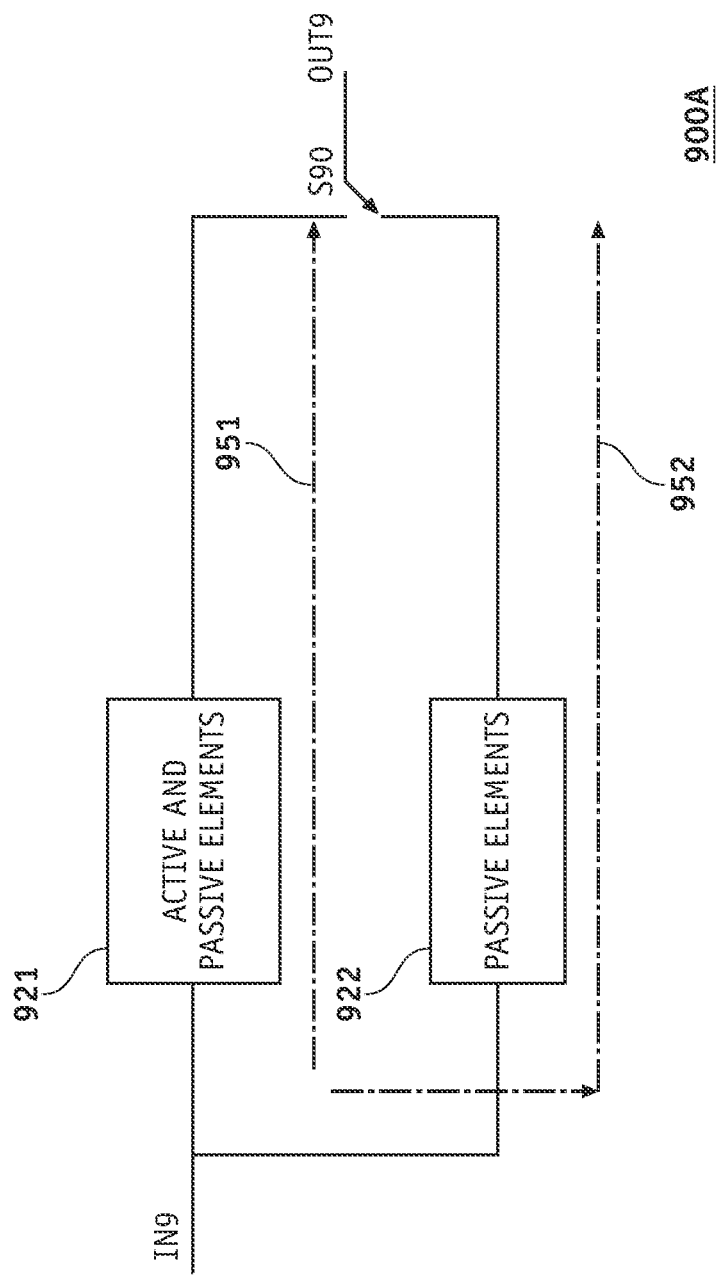
FIG. 9A shows a prior art RF receiver front-end.

FIG. 9A shows the block diagram of a typical prior art RF receiver front-end (900A). During operative conditions, the input signal is received at input terminal (IN9) and an output signal is generated at output terminal (OUT9). The RF front-end operates either in an active gain mode or a passive gain bypass mode. Depending on the position of the single-pole double-throw (SPDT) switch (S90), either one of active or passive bypass gain paths can be selected. In the active gain mode, gain path (951) including several active and passive elements (921) is traveled by the input signal. On the other hand, when operating in the passive gain mode, gain path (952) including passive elements (922) is traveled by the input signal. Examples of active elements include amplifiers having one or more transistors, and examples of passive elements include inductor, capacitors, and resistors.

With continued reference to FIG. 9A, in some applications, when operating in a gain mode, a gain amount of, for example −3 dB may be required. Depending on the bandwidth requirements of the RF front-end receiver that may include an LNA, and the amount of capacitance present in the passive path, meeting such a stringent gain requirement is a challenge. The addition of a phase shifter element in the bypass path to match the phase shifts of the active and passive gain paths will add to this challenge. When designing RF receiver front-ends, it is generally preferred to avoid adding phase shifter elements to an active gain path due to inherent attenuation of such elements. Nevertheless, the teachings of the present disclosure address the above-mentioned challenge by implementing phase shifter elements in both active and passive bypass paths, thereby splitting the task of phase shift matching among the two paths. As a result, the attenuation from the phase shifter element in the bypass path is reduced, while the addition of a portion of phase shift to the active path will still allow the design to meet the requirements of such path. Additionally, the design of the passive bypass path to meet stringent gain requirements (e.g. −3 dB) becomes also possible.

Figure 9B:
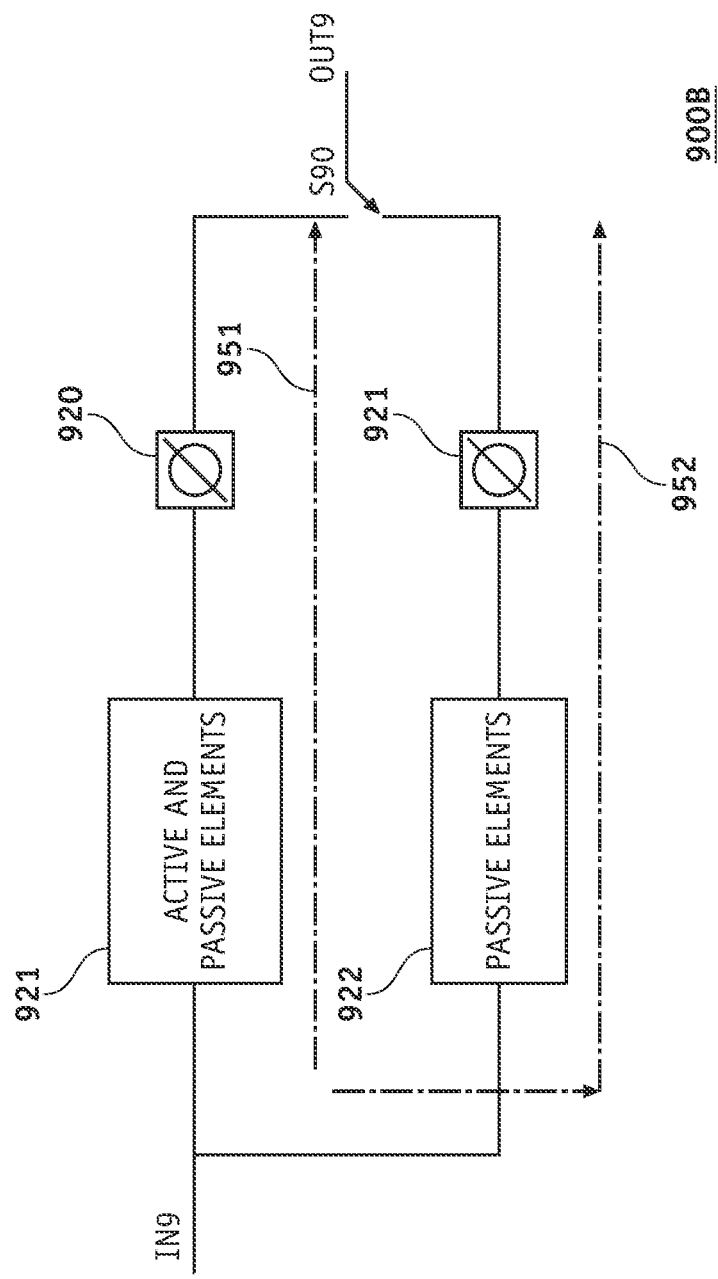
FIGS. 9B-9C show example RF receiver front-ends according to embodiments of the present disclosure.

In order to illustrate the above-mentioned teachings, reference is made to FIG. 9B showing the block diagram of an example RF receiver front-end (900B) according to an embodiment of the present disclosure. RF receiver front-end (900B) is similar to RF receiver front-end (900A) except for the addition of phase shifter elements (920, 921) disposed in gain paths (951, 952) respectively. In general, the amplifier implemented as part of the active elements of the active gain path (920) is an inverting amplifier introducing 180° phase shift in the active gain path (920). This is a relatively large phase shift that the phase shifter (921) in the passive bypass path (952) may not be able to handle on its own due to stringent gain requirements of the bypass path, as described above. As such, the phase shift matching of the gain paths (951, 952) is split among the two paths. Phase shifter elements (920, 921) provide phase shifts ($\varphi_1$, $\varphi_2$), respectively, where either of the sign of such phase shifts can be positive or negative. According to an embodiment of the present disclosure, the sum of such phase shifts is equal to 180°, or 0° i.e. $\varphi_1+\varphi_2=180°$, or 0°. In an optimized embodiment, the absolute value of the phase shift in the active path is less than the absolute value of the phase shift in the passive bypass path, i.e. $|\varphi_1| \leq |\varphi_2|$. Example values for the pairs of phase shifts ($\varphi_1$, $\varphi_2$) are (−20°, 20°), (30°, 150°), or (−30°, 210°). According to further embodiments of the present disclosure phase shifts ($\varphi_1$, $\varphi_2$) may satisfy the relation $\varphi_1+\varphi_2=360°-\varphi_{amp}$, wherein $\varphi_{amp}$ represents the phase shift introduced by the amplifier which can be different from 180°. Referring back to FIG. 9B, the signal travelling through path (951) generates, at output node (OUT9), an output signal with a first output signal phase shift relative to the input signal, and the signal travelling through path (952) generates, at output node (OUT9), an output signal with a second output signal phase shift relative to the input signal. Embodiments may be envisaged wherein, the difference between the first output signal phase shift and the second output signal phase shift is substantially the same. For example, such difference can be less than 5°, or 10°, or 20°. In other embodiments, the absolute value of any of the phase shifts ($\varphi_1$, $\varphi_2$) may be between 5° and 90°. An embodiment may also be implemented wherein active and passive elements (921) may include an inverting amplifier.

Figure 9C:
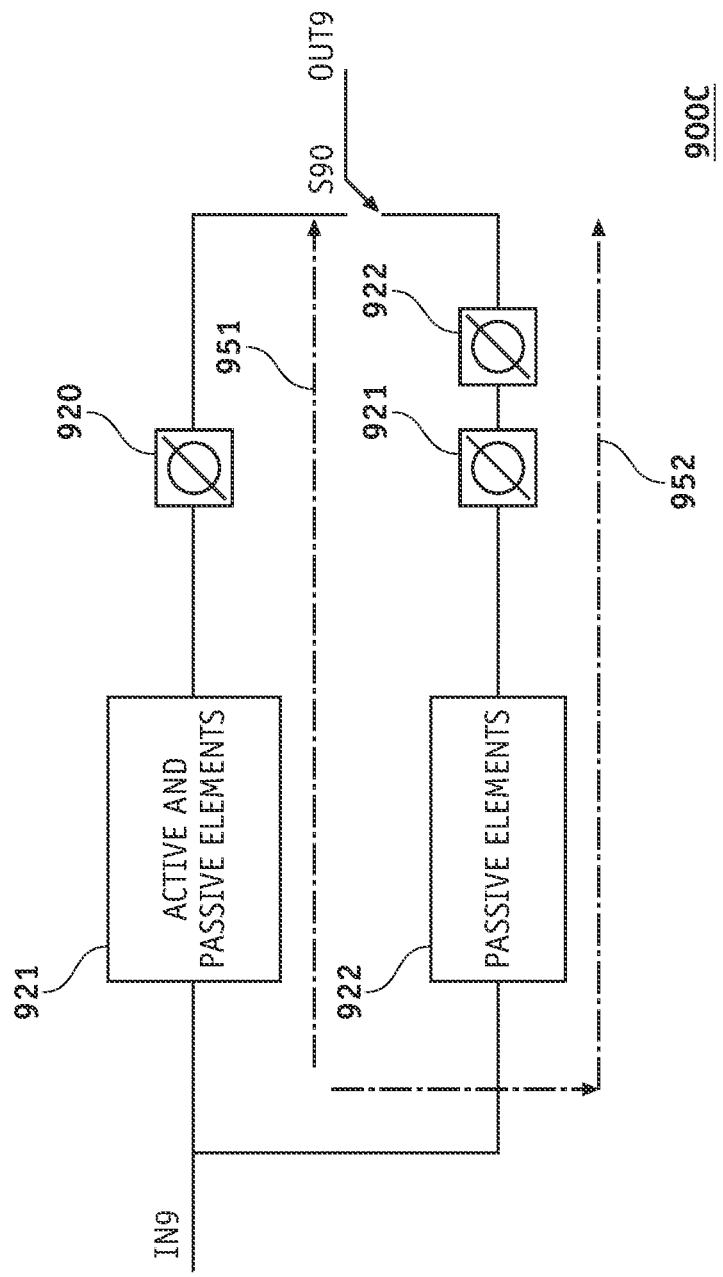
Figure 9D:
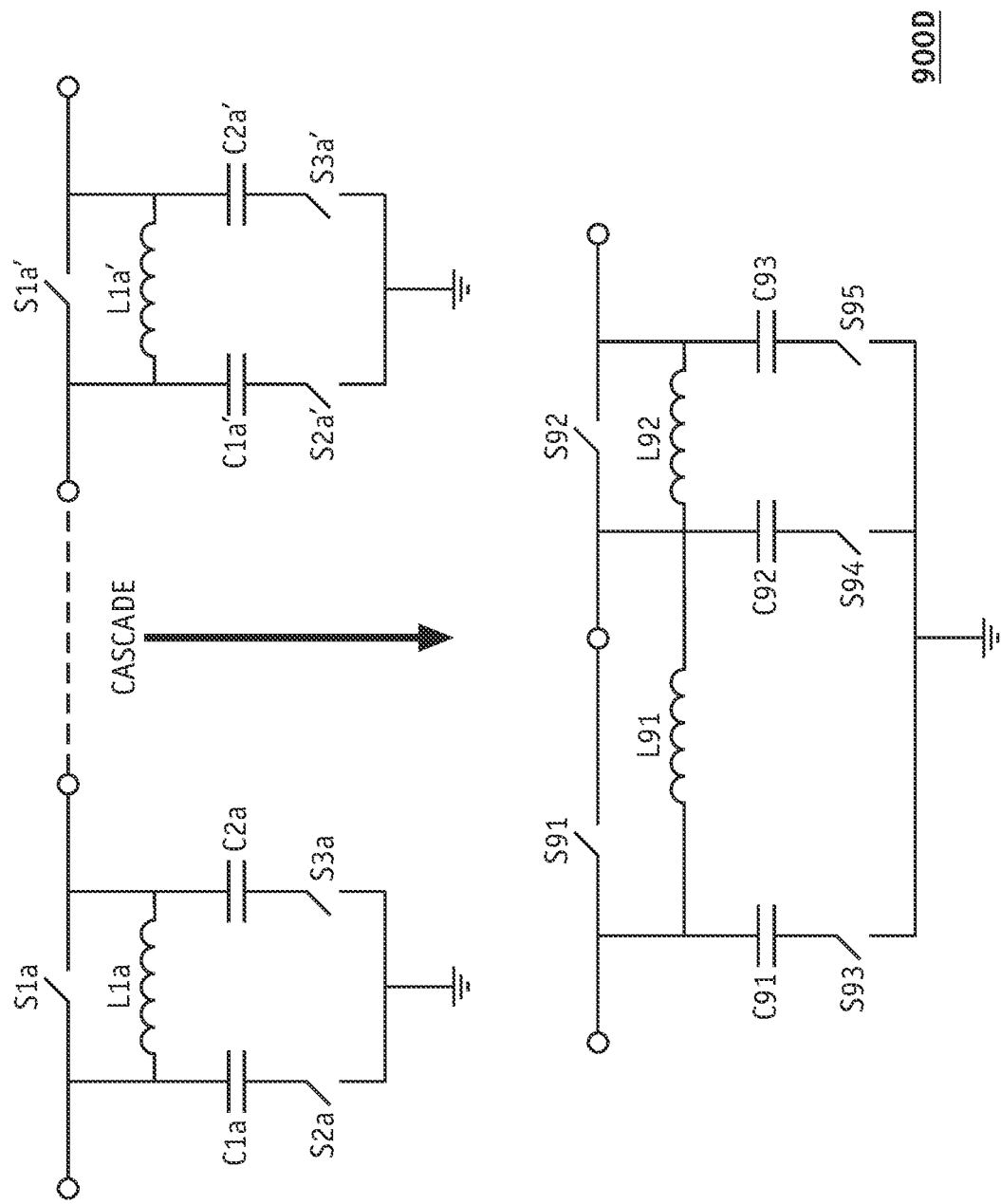
FIG. 9D shows example phase shifter elements arranged in a cascaded configuration.

With further reference to FIG. 9B, in an embodiment, two or more phase shifters arranged in a cascaded configuration can be used in any of the gain paths. The cascaded structure is beneficial in the scenarios where larger phase shifts (i.e. greater than 90°) are required in a given gain path, as it is more difficult to design a single phase shifter element to accommodate such larger phase shifts. FIG. 9C shows RF receiver front-end (900C) where two phase shifter elements (921, 922), arranged in a cascaded configuration, are disposed in the passive gain bypass path (952). When cascading phase shifter elements, in order to save the on-chip space, two or more elements of the phase shifter elements can be combined into one. This is illustrated in FIG. 9D where two instances of the embodiment of FIG. 3A (the drawings on top left and top right) are cascaded together, resulting in phase shifter element (900D), wherein a combination of capacitors (C2a, C1a') is replaced by capacitor (C92) and a combination of switches (S3a, S2a') is replaced by switch (S94). In applications where the requirements impose wider bandwidths, phase shifter elements arranged in parallel may be implemented.

Figure 9E:
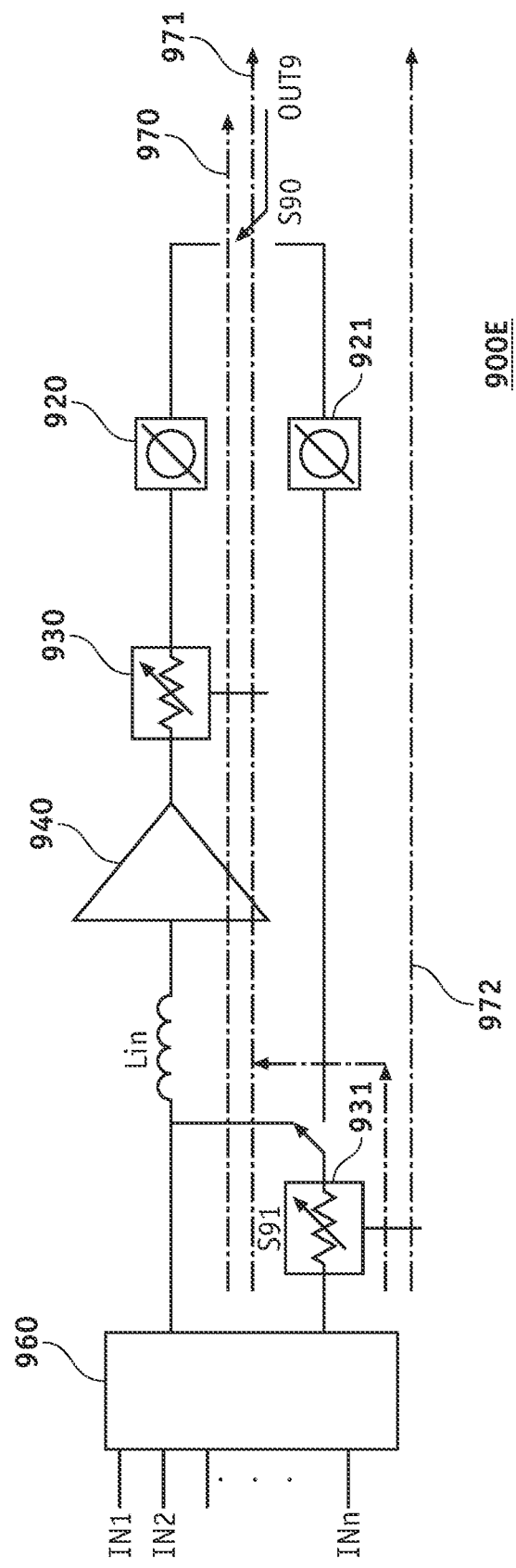
FIG. 9E shows an example RF receiver front-end according to an embodiment of the present disclosure.

FIG. 9E shows an example RF receiver front-end (900E) according to an embodiment of the present disclosure. RF receiver front-end (900E) is a multiple gain mode receiver front-end including an active high gain path (970), and active low gain path (971) and a passive bypass path (972). Depending on the position of switches (S90, S91) one of the gain paths is selected. The RF receiver front-end (900E) further comprises a band switch (960). Each of the inputs (IN1, . . . , INn) corresponds to a different frequency band and the desired operational band is selected through band switch (960). When in active gain mode of operation (high or low gain), after passing through input inductor (Lin), the selected input signal is received and amplified by amplifier (940), then attenuated by programmable attenuator (930) and phase shifted by phase shifter element (920) before reaching output terminal (OUT). The active high and low gain paths (970, 971) are similar, except that in the active low gain mode, the signal experiences an additional attenuation through programmable attenuator (931). In other words, active gain paths (970, 971) both include amplifier (940) which is an active device, and passive elements downstream from amplifier (940) as well as phase shifter (920). Both active gain paths further include inductor (Lin). Other passive elements including programmable attenuator (931) disposed upstream from amplifier (940) are only included in low gain path (971) and not in the high gain path (970). Active high gain and low gain path are selected, one at the time, via switch (S91). Amplifier (940) may include an LNA.

With continued reference to FIG. 9E, when in passive bypass mode, amplifier (940) is bypassed and after passing through programmable attenuator (931), the selected input signal is phase shifted by the phase shifter element (921) before reaching output terminal (OUT). What has been presented with regards to phase shifter elements (920,921) of FIG. 9B is equally applicable to phase shifter elements of the embodiment of FIG. 9E.

With further reference to FIGS. 9B, and 9E, as mentioned previously, it is generally preferable to avoid using large attenuation within the active gain path. More in particular, it is highly desired to avoid implementing inductors in the signal path. The reason for this is that inductors (in contrast with capacitors) have generally a low Q which can hurt the overall performance of the circuit when such inductors are in the signal path. According to preferred embodiments of the present disclosure, phase shifter elements (920, 921) of FIGS. 9B, 9E may be implemented using (high pass, low pass) topologies, respectively. In a high pass topology, the inductor is arranged in shunt and is not in the signal path, and as a result, the negative impact of such inductor's lower Q on the system performance is minimized.

Figure 9G:
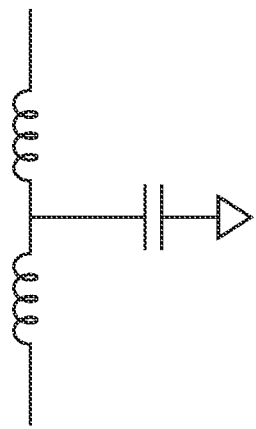
FIGS. 9F-9I show example phase shifter elements according to embodiments of the present disclosure.
Figure 9I:
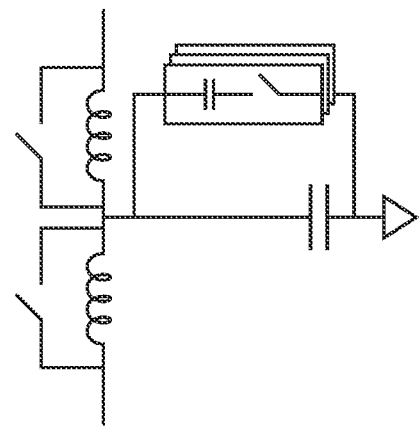
Figure 9F:
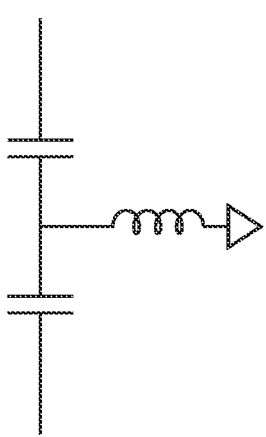
Figure 9H:
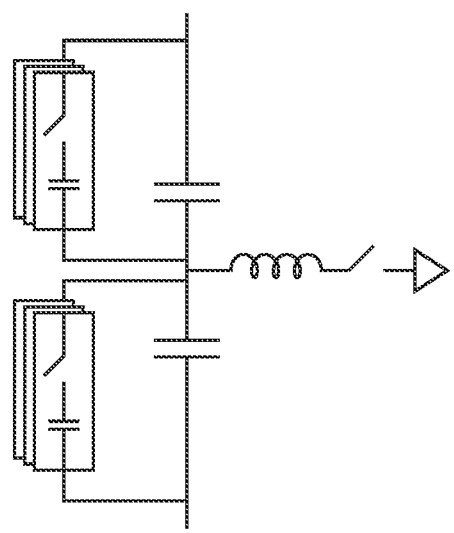

According to the teachings of the present disclosure, the phase shifter elements disclosed throughout this document can be either non-programmable or programmable. FIGS. 9F-9G show examples of non-programmable phase shifter elements. Their programmable counterparts are shown in FIGS. 9H-9I where banks of switchable capacitors arranged in parallel are implemented. The capacitors within the bank of capacitors can be selectively switched in and out, thereby adjusting to the required phase shift.

With further reference to FIGS. 9B, 9F, different gain paths are switched in one at a time. In other words, at any time instant, only one of the phase shifter elements (920, 921) is being used. According to the teachings of the present disclosure, in order to save on-chip space, instead of implementing, for example, two phase shifter elements (one for each of the active and passive paths), a single phase shifter element can be used, where one or more elements of the single phase shifter are reused by both active and passive paths.

Figure 10A:
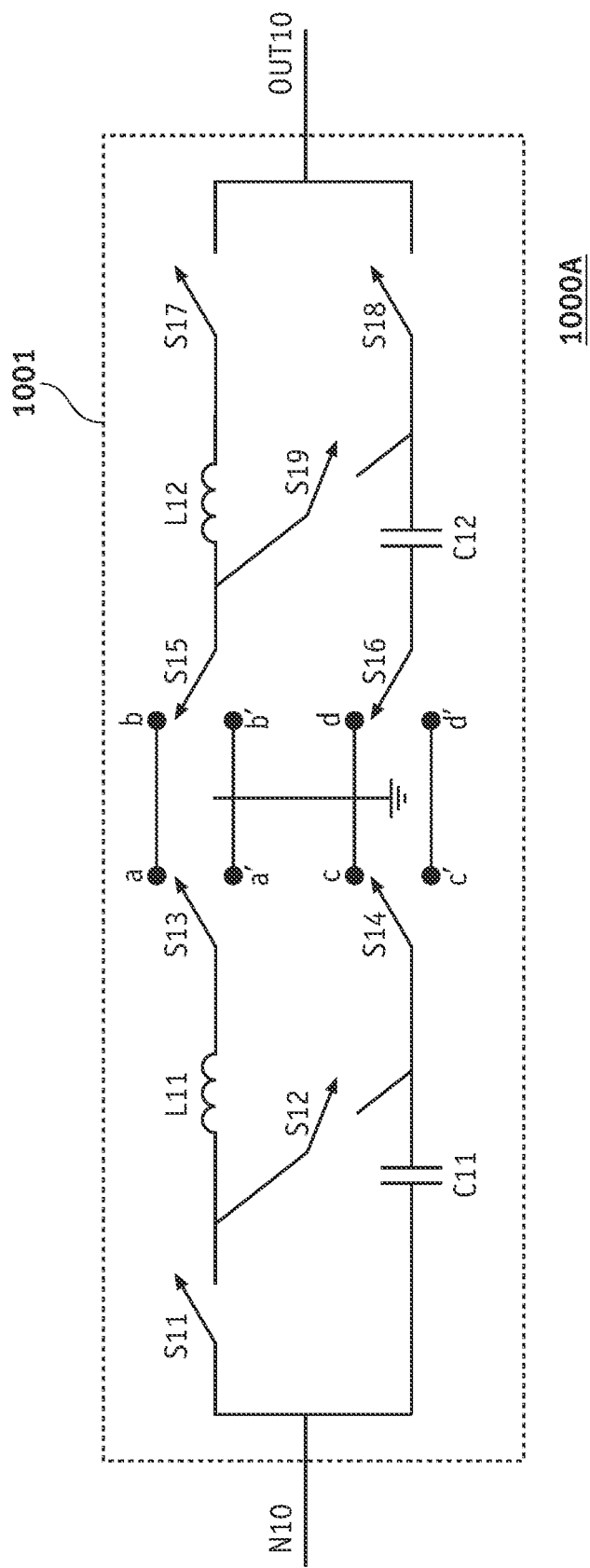
FIG. 10A shows a configurable phase shifter element according to an embodiment of the present disclosure.

In order to further clarify such teaching, reference is made to FIG. 10A showing a phase shifter element (1000A) in accordance with an embodiment of the present disclosure. Phase shifter element (1000A) is configurable and can be arranged according to different topologies. This phase shifter element comprises inductors (L11, L12), capacitors (C11, C12) and switches (S11, S12, . . . , S19). The input signal is received at input terminal (IN10) and is passed to output terminal (OUT10) after being phase shifted. Switches (S13, . . . , S16) are SPDT switches. In the active state, such switches are selectively connected to one of their respective two throws, and in an inactive state they are disconnected from both of their respective throws. As an example, in the active state, switch (S13) can be connected selectively to one of the terminals (a, a') and, in the inactive state, this switch is disconnected from both terminals (a, a'). As a further example, in the active state, switch (S14) can be connected selectively to one of the terminals (c, c') and, in the inactive state, this switch is disconnected from both terminals (c, c').

With continued reference to FIG. 10A, depending on the state of the switches, the phase shifter element (1000A) may be configured, for example, in two different topologies and therefore, the same embodiment can be used for both the active and passive gain path of a multi-path RF receiver front-end.

In order to demonstrate this, reference is made to FIG. 10B showing table (1000B) where the states of switches (S11, . . . , S19) for two different topologies, i.e. low pass TEE and high pass TEE are summarized. When configured in the low pass TEE topology, the inductors (L11, L12) are arranged in series, while capacitor (C12) has a shunt arrangement. When configured in the high pass TEE topology, the capacitors (C11, C12) are arranged in series, while inductor (L11) has a shunt arrangement. The configurable feature of phase shifter element (1000A) has been described here through the specific example of the TEE topology, however, embodiments according to the teachings of the present disclosure may be envisaged where switching between different arbitrary topologies (e.g. a PI topology) can be performed.

With reference to FIGS. 10B, 9B, and 9E, the low pass TEE topology can be selected when operating in passive bypass mode and the high pass TEE topology can be selected when operating in active gain mode.

Figure 10C:
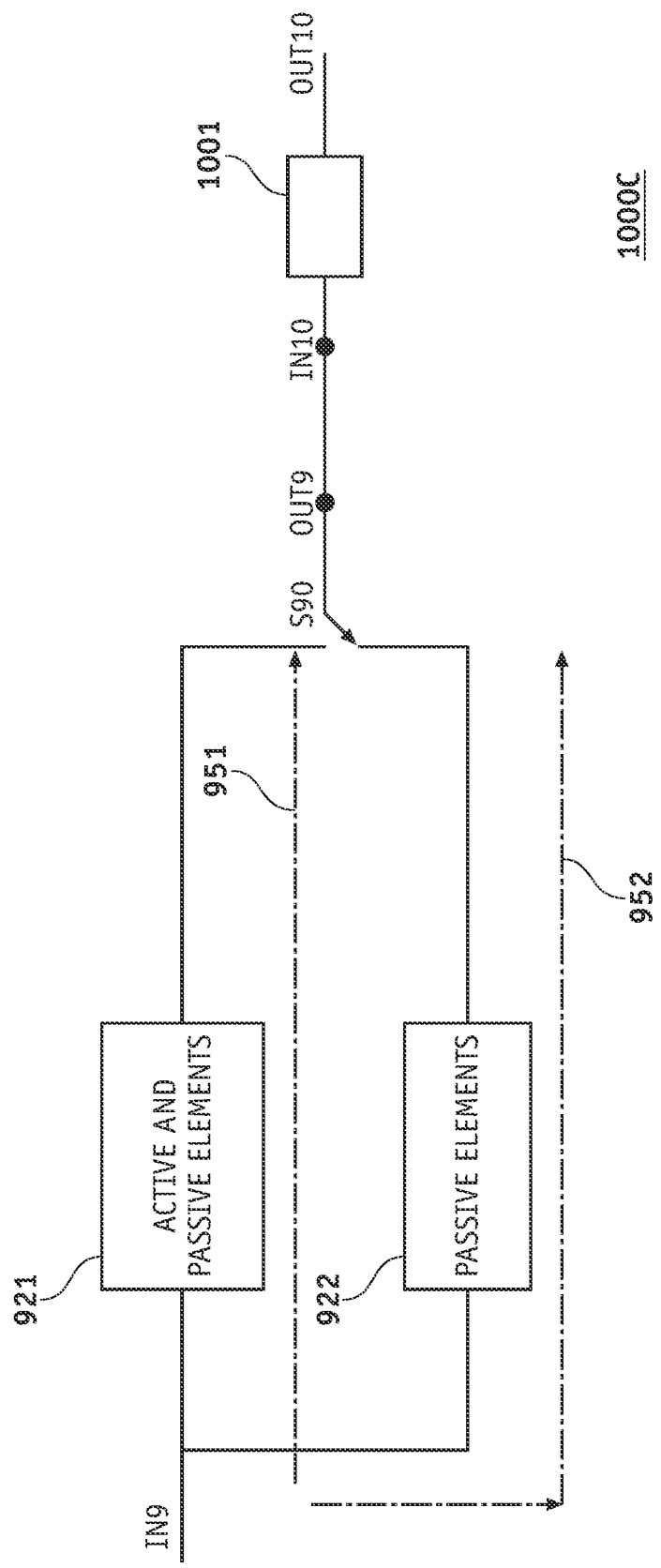
FIG. 10C show an example RF receiver front-end according to an embodiment of the present disclosure.

To further illustrate this, reference is made to FIG. 10C showing an example RF receiver front-end (1000C) according to an embodiment of the present disclosure. This RF receiver front-end is essentially the RF receiver front-end (900A) of FIG. 9A connected in series with phase shifter element (1000A) of FIG. 10A. Element (1001) of FIG. 10C represents the same element (1001) of FIG. 10A. When operating in passive bypass mode, i.e. when gain path (952) is selected, element (1001) is configured to have a low pass TEE topology in accordance with the state of switches as shown in table (1000B) of FIG. 10B. When operating in the active gain mode, i.e. when gain path (951) is selected, element (1001) is configured to have a high pass TEE topology in accordance with the state of switches as shown in table (1000B) of FIG. 10B.

The disclosed teachings can be applied to LNAs and any other type of multi-path amplifiers requiring phase shift matchings. The amplifiers benefiting from the disclosed methods and devices can be single stage or multi-stage amplifiers and may have differential or single-ended topologies. The switches used in the disclosed embodiments may include field-effect transistors and can be implemented and each switch may include one transistor or a stack of transistors arranged in series. The disclosed RF front-ends can be used as part of an integrated circuit, a communication module or system. The constituent elements of the disclosed phase shifter elements may include lumped or distributed elements. The disclosed embodiments may be implemented entirely on-chip or using a combination of on-chip and off-chip elements.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A multi-path radio frequency (RF) front-end comprising:
a plurality of first path elements forming a first path extending between an input node and an output node of the RF front end while the RF front-end is operating in a first mode, the first path elements including a first phase shifter providing a first phase shift;
a plurality of second path elements forming a second path extending between the input node and the output node of the RF front end while the RF front-end is operating in a second mode, the second path elements including a second phase shifter providing a second phase shift;
the RF front-end providing a first output signal at the output node while the RF front-end is operating in the first mode, the first output signal having a first output signal phase shift relative to an input signal applied to the input node;
the RF front-end providing a second output signal at the output node while the RF front-end is operating in the second mode, the second output signal having a second output signal phase shift relative to an input signal applied to the input node;
the first phase shift and the second phase shift being selected so that the first output signal and the second output signal are substantially in phase.

2. The RF front-end of claim 1, wherein the difference between the first output signal phase shift and the second output signal phase shift is less than 5 degrees.

3. The RF front-end of claim 1, wherein the first path elements further include an active element and one or more passive elements, and the active element comprises an inverting amplifier circuit.

4. The RF front-end of claim 1, wherein an absolute value of the first phase shift is less than an absolute value of the second phase shift.

5. The RF front-end of claim 3, wherein the active element phase shift is about 180°.

6. The RF front-end of claim 1, wherein the first phase shifter is a high pass phase shifter and the second phase shifter is a low pass phase shifter.

7. The RF front-end of claim 6, wherein the high pass phase shifter comprises a TEE phase shifter including a first and a second capacitor arranged in a in series configuration and an inductor arranged in a shunt configuration.

8. The RF front-end of claim 1, wherein the first and the second phase shifters include TEE phase shifters or PI phase shifters, each including a capacitive element and an inductive element.

9. The RF front-end of claim 8, wherein the TEE phase shifters and/or the PI phase shifters include phase shifter switches configured to selectively switch in and out elements of the TEE phase shifters or PI Phase shifters.

10. The RF front-end of claim 8, wherein the capacitive element comprises a plurality of capacitors, each capacitor being serially connected to a corresponding series switch, and being configured to be selectively switched in and out by the corresponding series switch.

11. The RF front-end of claim 1, wherein at least one of the first and second phase shifters comprises a plurality of phase shifters arranged in a cascaded configuration.

12. The RF front-end of claim 1, wherein at least one of the first and second phase shifters comprises a plurality of phase shifters arranged in a parallel configuration.

13. The RF front-end of claim 12, wherein;
said at least one of the first and second phase shifters is the second phase shifter, comprising said plurality of phase shifters; and
said plurality of phase shifters comprises a first phase shifter and a second phase shifter sharing a shared element common to the first phase shifter and the second phase shifter.

14. The RF front-end of claim 12, wherein;
said at least one of the first and second phase shifters is the second phase shifter, comprising said plurality of phase shifters; and
said plurality of phase shifters comprises a first phase shifter and a second phase shifter sharing a shared element common to the first phase shifter and the second phase shifter.

15. The RF front-end of claim 1, wherein the first path comprises a first active gain path having a first gain, the second path comprises a second active gain path having a second gain, and the first gain is greater than the second gain.

16. The RF front-end of claim 1, wherein the first path comprises a first active gain path having a first gain, the second path comprises a passive bypass path having a second gain, and the first gain is different from the second gain.

17. The RF front-end of claim 16, wherein the second gain is a negative gain or an attenuation.

18. The RF front-end of claim 16, wherein:
the first active gain path and the passive bypass path are configured to be selectively switched in or switched out;
in an active gain mode, the first active gain path is switched in and the passive bypass path is switched out, and
in a passive bypass gain mode, the first active gain path is switched out and the passive bypass path is switched in.

19. The RF front-end of claim 1, wherein the first path elements comprise a low noise amplifier (LNA).

20. The RF front-end of claim 19, wherein the LNA comprises an amplifier selected from the group consisting of: a single stage amplifier, a multi-stage amplifier, an amplifier with differential topology, and an amplifier with single-ended topology.

21. The RF front-end of claim 1, wherein:
the first path elements comprise a plurality of first passive elements; and
the plurality of first passive elements and the first phase shifter comprise a shared passive element common to the plurality of first passive elements and the first phase shifter.

22. The RF front-end of claim 21, where the shared passive element is configured to perform output matching of the RF front-end.

23. The RF front-end of claim 1, wherein
the first path elements comprise a plurality of first passive elements;
the first path comprises a first active gain path;
the plurality of first passive elements comprise a first set of passive elements disposed downstream of the active element and a second set of passive elements including a programmable attenuator and disposed upstream of the active element;
the active element, the first set of passive elements and the second set of passive elements form a second active gain path, and
the second set of passive elements form a passive bypass path extending from the input node to the output node.

24. The RF front-end of claim 23, wherein the first and the second active gain paths, and the passive bypass path are configured such that only one path is selectively switched in at a time.

25. A multi-path radio frequency (RF) front-end comprising:
an active element, a plurality of first passive elements, and a configurable phase shifter forming a first active gain path; and
a plurality of second passive elements forming a passive bypass path together with the configurable phase shifter,
wherein:
a) the first active gain path and the passive bypass path are configured to be selectively switched in or out;
b) in a first state:
the first active gain path is switched in;
the passive bypass path is switched out, and
the configurable phase shifter element is configured to be arranged according to a first topology;
c) in a second state:
the first active gain path is switched out;
the passive bypass path is switched in;
the configurable phase shifter element is configured to be arranged according to a second topology different from the first topology.

26. The RF front-end of claim 25, wherein the first topology is a high pass topology and the second topology is a low pass topology.

27. The RF front-end of claim 26, wherein:
the configurable phase shifter comprises a first inductor, a second inductor, a first capacitor and second capacitor;
when arranged according to the low pass topology, the first and the second inductors are arranged in a series configuration and the second capacitor is arranged in a shunt configuration, and
when arranged according to the high pass topology, the first and the second capacitors are arranged in a series configuration and the first inductor is arranged in a shunt configuration.

* * * * *